(12) United States Patent
Tagome

(10) Patent No.: US 8,351,231 B2
(45) Date of Patent: Jan. 8, 2013

(54) POWER CONVERSION DEVICE

(75) Inventor: Masaki Tagome, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/576,736

(22) PCT Filed: Feb. 4, 2011

(86) PCT No.: PCT/JP2011/000641
§ 371 (c)(1),
(2), (4) Date: Aug. 2, 2012

(87) PCT Pub. No.: WO2011/096232
PCT Pub. Date: Aug. 11, 2011

(65) Prior Publication Data
US 2012/0307540 A1  Dec. 6, 2012

(30) Foreign Application Priority Data
Feb. 5, 2010 (JP) ................. 2010-024104

(51) Int. Cl.
*H03K 5/13* (2006.01)
(52) U.S. Cl. ............... 363/71; 326/91; 327/109
(58) Field of Classification Search ........... 363/71; 323/272, 282; 326/85, 87, 91; 327/109
See application file for complete search history.

(56) References Cited

U.S. PATENT DOCUMENTS

| 5,399,908 A | 3/1995 | Donaldson |
| 6,208,541 B1 | 3/2001 | Itoh et al. |
| 6,249,111 B1 * | 6/2001 | Nguyen ............ 323/282 |
| 2001/0038540 A1 | 11/2001 | Itoh et al. |
| 2004/0252430 A1 | 12/2004 | Oumaru et al. |
| 2009/0224734 A1 * | 9/2009 | Tang et al. ............ 323/272 |

FOREIGN PATENT DOCUMENTS

| JP | 58-123627 | 8/1983 |
| JP | 61-72411 | 4/1986 |
| JP | 4-157918 | 5/1992 |
| JP | 6-90151 | 3/1994 |

(Continued)

OTHER PUBLICATIONS

International Search Report mailed on Apr. 19, 2011 in corresponding International Application No. PCT/JP2011/000641.

(Continued)

*Primary Examiner* — Harry Behm
(74) *Attorney, Agent, or Firm* — Wenderoth, Lind & Ponack, L.L.P.

(57) ABSTRACT

The present invention aims to provide a power converter with an arm including switching devices connected in parallel, realizing long lifespans of switching devices. An inverter includes an upper and a lower arm, and gate drive circuits each driving the corresponding arm according to a gate control signal Gup_s indicating ON/OFF periods. Each arm includes switching devices connected in parallel. Each gate drive circuit includes: a switching gate control circuit 230$u$ bringing a switching device 210$u$ into conduction at the beginning of the ON period and bringing the same out of conduction within the ON period; and a conduction gate control circuit 231$u$ bringing switching devices 211$u$ and 212$u$ within a period from when the switching device 210$u$ is brought into conduction until the same is brought out of conduction, wherein the switching device 210$u$ has a lower parasitic capacitance than the switching devices 211$u$ and the 212$u$.

15 Claims, 23 Drawing Sheets

FOREIGN PATENT DOCUMENTS

| | | |
|---|---|---|
| JP | 9-285120 | 10/1997 |
| JP | 2001-25259 | 1/2001 |
| JP | 2003-134819 | 5/2003 |
| JP | 2005-6412 | 1/2005 |
| JP | 2006-42529 | 2/2006 |
| JP | 2007-74771 | 3/2007 |
| JP | 2009-81969 | 4/2009 |
| JP | 2009-142070 | 6/2009 |
| JP | 2010-29024 | 2/2010 |
| WO | 01/20757 | 3/2001 |

OTHER PUBLICATIONS

International Preliminary Report on Patentability mailed on May 22, 2012 in corresponding International Application No. PCT/JP2011/000641 (with English translation and verification of translation).

* cited by examiner

POWER CONVERSION DEVICE

TECHNICAL FIELD

The present invention relates to a power converter such as an inverter and a DC/DC converter having an arm composed of a plurality of switching devices connected in parallel.

BACKGROUND ART

In recent years, power converters such as inverters and DC/DC converters have increased their output power for the use in hybrid electric vehicles, electric vehicles, and the likes. In a high-output power converter, switching devices constituting an arm are required to manage high voltage and high current. To support high voltage, the switching devices are connected in series, and to support high current, the switching devices are connected in parallel. For example, Patent Literature 1 discloses an inverter having an arm composed of a plurality of switching devices connected in parallel.
Citation List
Patent Literature
[Patent Literature 1] Japanese Patent Application Publication No. 2005-6412

SUMMARY OF INVENTION

Technical Problem

When switching devices are connected in parallel, it is likely that a large amount of current flows in a particular device due to variations in the electrical properties of the devices. Hence, the device in which a larger amount of current flows generates a large amount of heat, and the lifespan of the device is likely to be short. In particular, parallel connection is more problematic during the switching operation than during the regular operation. That is, in addition to the variations in the electrical properties (e.g. on-resistance, threshold voltage), the difference in the junction temperature, the difference in the wiring inductance, and variations in properties of the gate drive circuits have an influence during the switching operation, and when compared with the case of a single device, the problem of variations is more significant in the case of the switching operation.

The present invention is made in view of the problems above, and aims to provide a power converter having an arm composed of a plurality of switching devices connected in parallel and realizing long lifespans of the switching devices.
Solution to Problem To achieve the aim, the present invention provides a power converter comprising: an upper arm; a lower arm; and gate drive circuits each configured to drive a corresponding one of the arms according to a reference signal, the reference signal having a first-potential period and a second-potential period, wherein each arm includes a set of switching devices connected in parallel, each gate drive circuit includes: a switching gate control circuit configured to bring a first switching device among the corresponding set of switching devices at the beginning of the first-potential period, and to bring the first switching device out of conduction at a point within the first-potential period; and a conduction gate control circuit configured to bring a second switching device among the corresponding set of switching devices into conduction at a point within a period from when the first switching device is brought into conduction, which corresponds to the beginning of the first-potential period, until the first switching device is brought out of conduction, and the first switching device has a smaller parasitic capacitance than the second switching device.
Advantageous Effects of Invention In the power converter pertaining to the present invention with the structure described in Solution to Problem, among the switching devices included in the arm, the switching loss occurs in the first switching device which performs the switching operation, and the conduction loss occurs in the second switching device which performs the conduction operation.

Hence, in the first switching device, heat caused by switching loss is generated, but heat caused by conduction loss is suppressed. In the second switching device, heat caused by conduction loss is generated, but heat caused by switching loss is suppressed. Therefore, the switching devices are prevented from having a short lifespan due to heat generation.

Conduction loss and switching loss, which are power loss occurring in switching devices and are recognized as common properties of switching devices, have a trade-off relationship. That is, a switching device with a reduced conduction loss has a relatively large switching loss, and a switching device with a reduced switching loss has a relatively large conduction loss.

In the power converter pertaining to the present invention, however, switching loss and conduction loss occur in different switching devices. Hence, switching loss and conduction loss, which conventionally have a trade-off relationship, can be each reduced in terms of the entire apparatus. That is, the present invention provides a highly efficient power converter that can reduce both types of loss in terms of the entire apparatus.

DESCRIPTION OF EMBODIMENTS

The following describes embodiments of a power converter pertaining to the present invention, with reference to the drawings.

Embodiment 1

Figure 1:
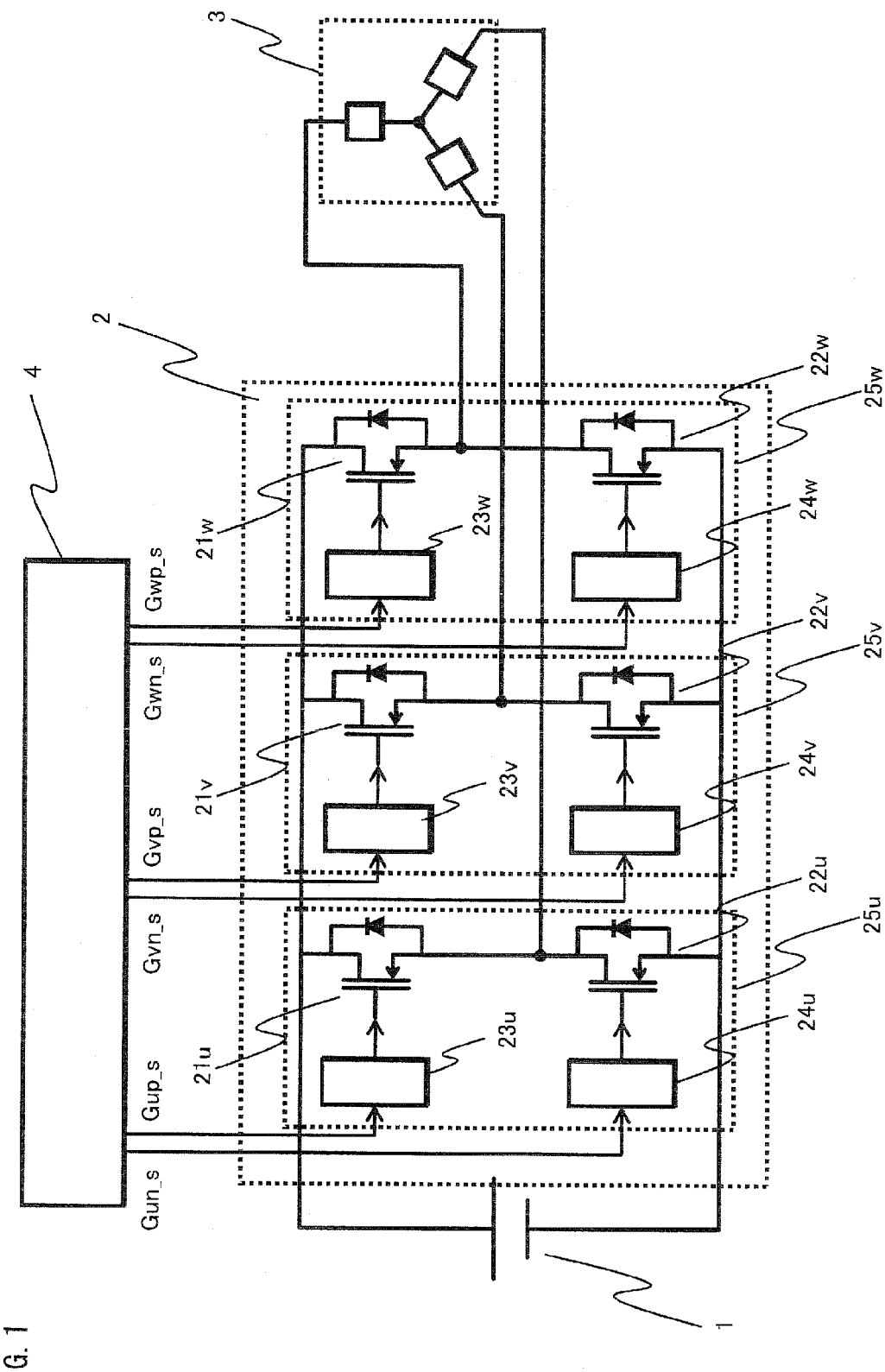
FIG. 1 shows the entire structure of a synchronous motor drive system using a power converter pertaining to the present invention.

FIG. 1 shows the entire structure of a synchronous motor drive system using a power converter pertaining to the present invention.

The synchronous motor drive system shown in the drawing includes a battery 1, an inverter 2 as a power converter pertaining to the present invention, a motor 3, and a control circuit 4.

The battery 1 is a DC power source, and supplies DC power to the inverter 2.

The inverter 2 is a three-phase inverter that converts DC power supplied by the batter 1 to AC power and supplies three-phase AC power to the motor 3.

The motor 3 is rotatably driven by three-phase AC power supplied from the inverter 2.

The control circuit 4 controls the inverter 2 so that the motor 3 operates in a desired manner.

The following describes the details of the inverter 2 pertaining to the present embodiment.

An inverter has the same number of legs as AC power outputs. The inverter 2 pertaining to the present embodiment includes a leg 25u, a leg 25v and a leg 25w.

The leg 25u includes: an upper arm 21u and a lower arm 22u, which are connected in series between the positive terminal and the negative terminal of the battery 1 (the upper arm 21u is connected to the positive side, and the lower arm 22u is connected to the negative side); and an upper arm-side gate drive circuit (upper arm drive circuit) 23u and a lower arm-side gate drive circuit (lower arm drive circuit) 24u, which respectively correspond to the upper arm 21u and the lower arm 22u. Similarly, the legs 25v and 25w respectively include upper arms 21v and 21w, lower arms 22v and 22w, upper arm-side gate drive circuits (upper arm drive circuits) 23v and 23w, and lower arm-side gate drive circuits (lower arm drive circuits) 24v and 24w.

Figure 2:
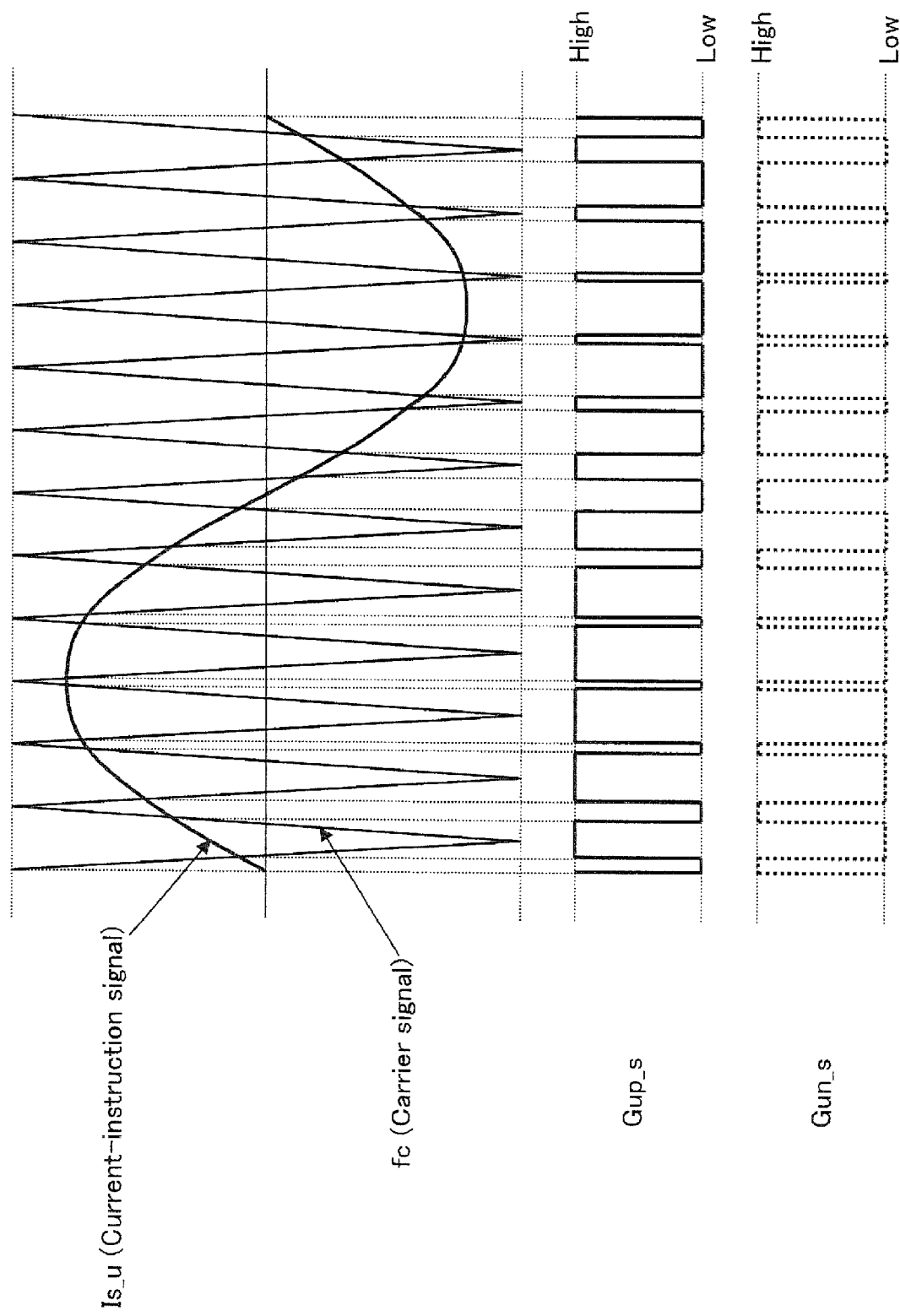
FIG. 2 is a waveform diagram showing switching operations performed by an upper arm and a lower arm of an inverter.

FIG. 2 is a waveform diagram showing basic operations of the upper arm-side gate driver circuit and the lower arm-side gate drive circuit for the U phase.

The symbol Is_u represents a current-instruction signal, which is externally input to the control circuit 4 and indicates a waveform of a current to be applied to the U phase. This waveform matches the waveform of the current to be applied to the U-phase coil of the motor 3. The symbol fc represents a carrier signal used for PWM operations, which is generated by a carrier signal generation circuit included in the control circuit 4. The control circuit 4 compares the carrier signal fc with the current-instruction signal and thereby generates a gate control signals Gup_s and Gun_s, and outputs the gate control signals Gup_s and Gun_s to the upper arm-side gate drive circuit and the lower arm-side gate drive circuit, respectively.

Although only the U-phase among the three phases is described above, the control circuit 4 also generates and outputs gate control signals Gvp_s and Gvn_s and gate control signals Gwp_s and Gwn_s for the V phase and the W phase, respectively. In the following, only the U-phase will be explained. However, the inverter 2 has the same structure for the V phase and the W phase.

Figure 3:
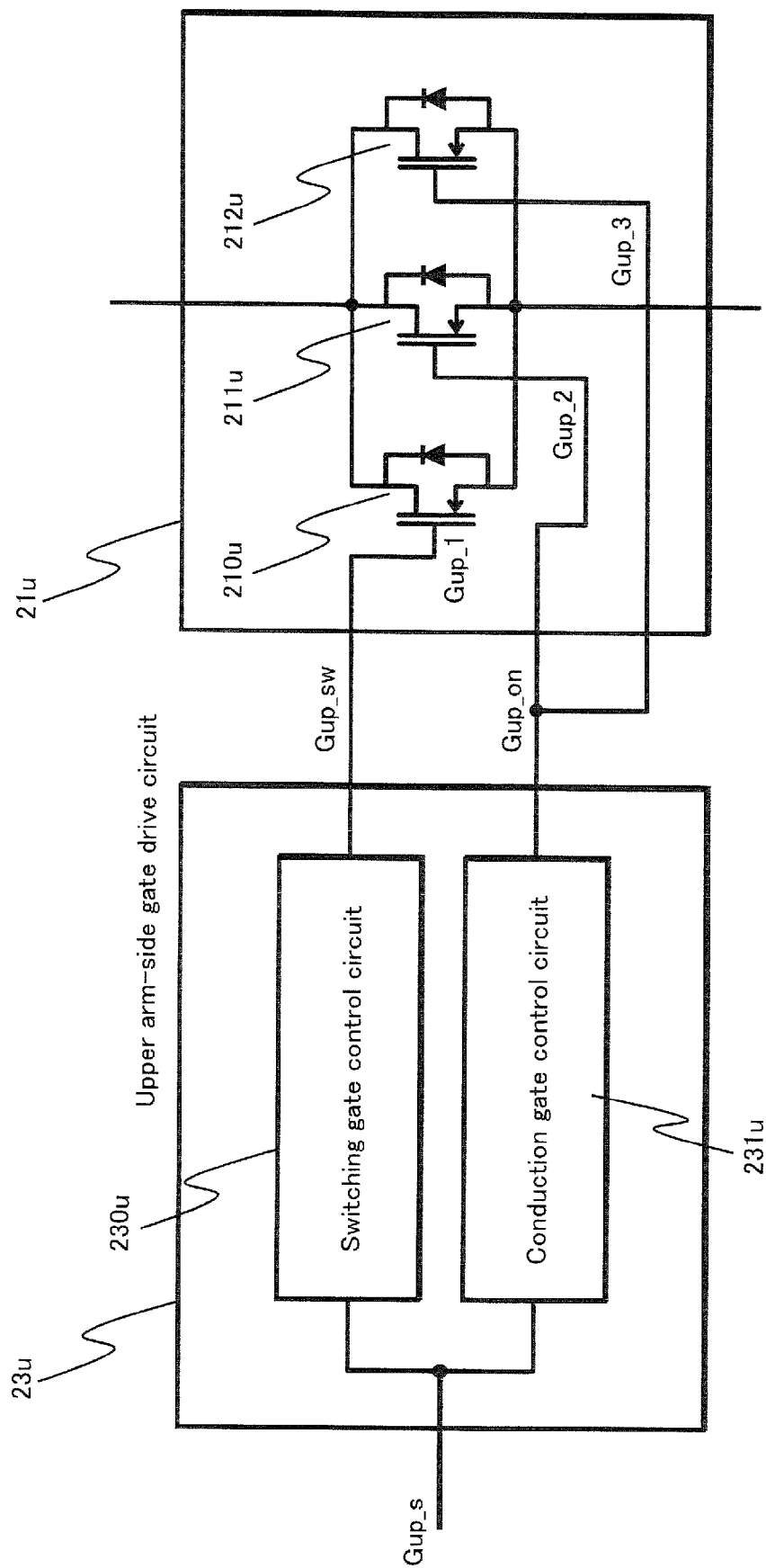
FIG. 3 shows detailed structures of a gate control circuit and an arm of an inverter pertaining to Embodiment 1.

FIG. 3 shows the details of the upper arm 21u and the upper arm-side gate drive circuit 23u depicted in FIG. 1.

The upper arm-side gate drive circuit 23u includes a switching gate control circuit 230u, and a conduction gate control circuit 231u. The upper arm 21u includes three switching devices 210u, 211u and 212u. Here, each of the switching devices 210u, 211u and 212u is made up of a Metal-Oxide-Semiconductor Field-Effect Transistor (MOSFET). The switching gate drive circuit 230u is connected to the control terminal of the switching device 210u, and the conduction gate control circuit 231u is connected to the respective control terminals of the switching devices 211u and 212u. The switching devices 210u, 211u and 212u are connected in parallel, and their respective high electrical potential-side primary terminals are connected to one another, and their respective low electrical potential-side primary terminals are connected to one another.

The gate control signal Gup_s output from the control circuit 4 is input to each of the switching gate control circuit 230u and the conduction gate control circuit 231u. Based on the gate control signal Gup_s, the switching gate control circuit 230u outputs a switching gate drive signal Gup_sw to the control terminal of the switching device 210u. The conduction gate control circuit 231u outputs a conduction gate drive signal Gup_on to the respective control terminals of the switching devices 211u and 212u.

Figure 4:
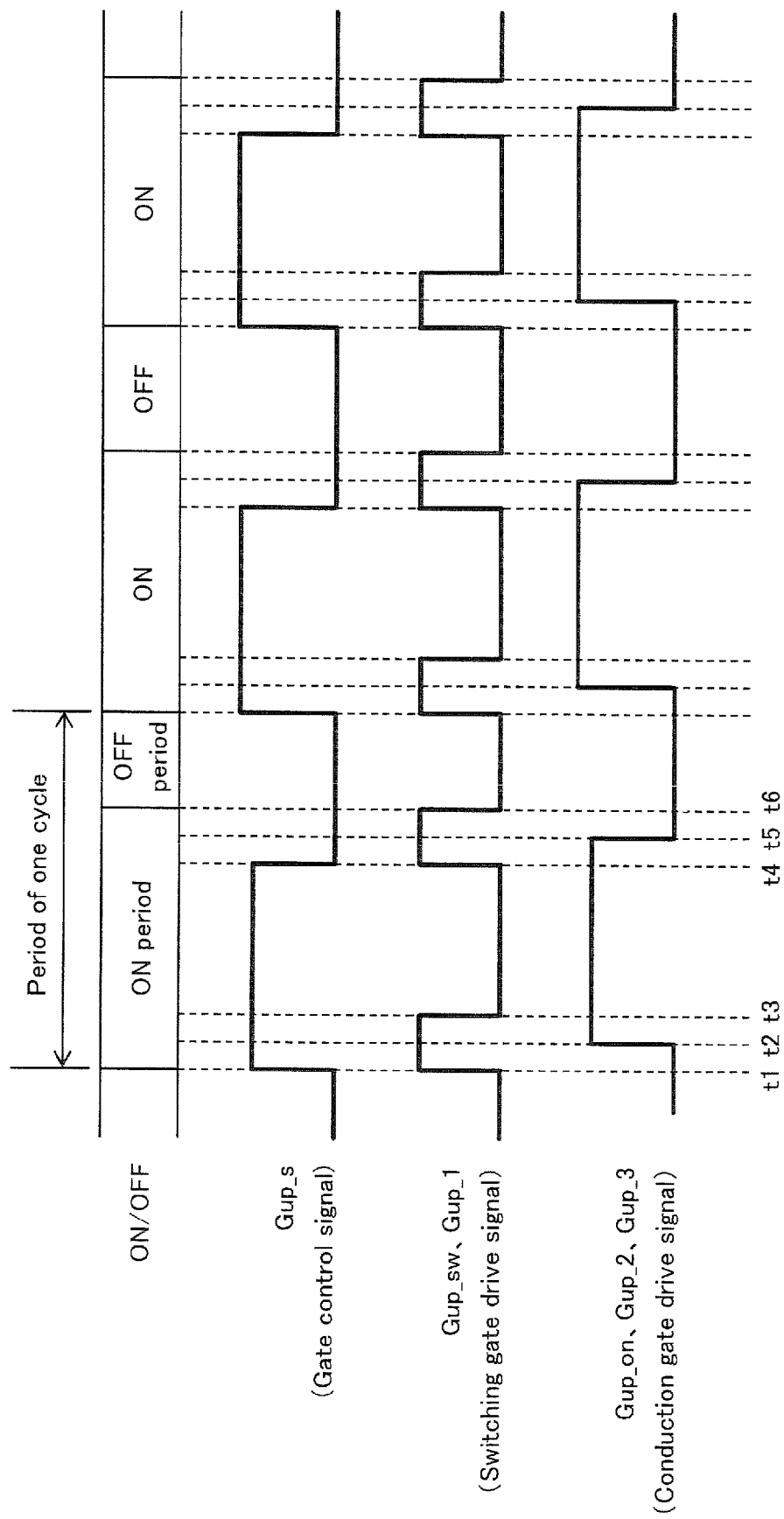
FIG. 4 is a timing chart illustrating operations performed by a gate control circuit.

The following describes the details of the switching gate drive signal Gup_sw output by the switching gate control circuit 230u and the conduction gate drive signal Gup_on output by the conduction gate control circuit 231u, with reference to FIG. 4.

The gate control signal Gup_s output by the control circuit 4 has a first-potential period, for which the electrical potential is at the High level, and a second-potential period, for which the electrical potential is at the Low level. The gate control signal Gup_s serves as a reference signal used by the switching gate control circuit 230u and the conduction gate control circuit 231u to operate.

The switching gate control circuit 230u raises the switching gate drive signal Gup_sw at time t1, which is when a rise is detected in the gate control signal Gup_s input by the control circuit 4. Then, the switching gate control circuit 230u drops the switching gate drive signal Gup_sw within a shorter period than the first-potential period for which the electrical potential of the gate control signal Gup_s is at the High level. That is, the switching gate control circuit 230u drops the switching gate drive signal Gup_sw at time t3. Furthermore, the switching gate control circuit 230u raises the switching gate drive signal Gup_sw again at time t4, which is when a drop is detected in the gate control signal Gup_s. Then, the switching gate control circuit 230u drops the switching gate drive signal Gup_sw within a shorter period than the second-potential period for which the electrical potential of the gate control signal Gup_s is at the Low level. That is, the switching gate control circuit 230u drops the switching gate drive signal Gup_sw at time t6.

Through the operations described above, the switching gate control circuit 230u outputs, as the switching gate drive signal Gup_sw, a square wave twice within the period of one cycle of the gate control signal Gup_s.

On the other hand, the conduction gate control circuit 231u raises the conduction gate drive signal Gup_on at time t2 in the period of one cycle of the gate control signal Gup_s. The time t2 indicates a point within the period between t1 and t3 for which the switching gate drive signal Gup_sw is raised to the High level along with the rise of the gate control signal Gup_s. Then, the conduction gate control circuit 231u drops the conduction gate drive signal Gup_on at time t5. The time t5 is a point within the period between t4 and t6 for which the switching gate drive signal Gup_sw is raised to the High level along with the drop of the gate control signal Gup_s.

By the operations described above, the upper arm 21u will be conductive during the period between t1 and t6, for which at least one of the switching gate drive signal Gup_sw and the conduction gate drive signal Gup_on is at the High electrical potential. In the upper arm 21u, however, the operation for switching is performed by the switching device 210u, and the operation for establishing electrical conduction is performed by the switching device 211u and the switching device 212u. As a result, among losses occurring in the upper arm 21u, switching loss occurs in the switching device 210u, and conduction loss occurs in the switching device 211u and the switching device 212u.

As described above, in the inverter pertaining to the present embodiment, the location where switching loss occurs and the location where conduction loss occurs are separated. Specifically, the farmer occurs in the switching device that performs the switching operation and the latter occurs in the switching devices that perform the conduction operation. Conduction loss and switching loss, which are power loss occurring in switching devices and are recognized as common properties of switching devices, have a trade-off relationship. That is, a switching device with a reduced conduction loss has a relatively large switching loss, and a switching device with a reduced switching loss has a relatively large conduction loss.

In the inverter pertaining to the present embodiment, however, switching loss and conduction loss occur in different switching devices. Hence, switching loss and conduction loss, which conventionally have a trade-off relationship, can be each reduced in terms of the entire apparatus. That is, the present invention provides a highly efficient inverter that can reduce both types of loss in terms of the entire apparatus.

Note that the switching devices 210u, 211u and 212u, which constitute the upper arm and are connected in parallel, do not necessarily have the same maximum voltage rating and the same maximum current rating. For example, the switching device 210u, which mainly performs the switching operation, may have a relatively small maximum current rating compared to the switching devices 211u and 212u each of which mainly performs the conduction operation. Generally, the level of the maximum current rating depends on the chip area of the switching device. Therefore, as the maximum current rating decreases, the conduction loss increases, but the switching loss decreases. Regarding the switching device 210u, which mainly performs the switching operation, it is not very necessary to consider the conduction loss. Therefore, in order to reduce the switching loss, it is preferable that the maximum current rating is low. It is however necessary to conduct the maximum current, and to allow the occurrence of loss for a short period.

Figure 5:
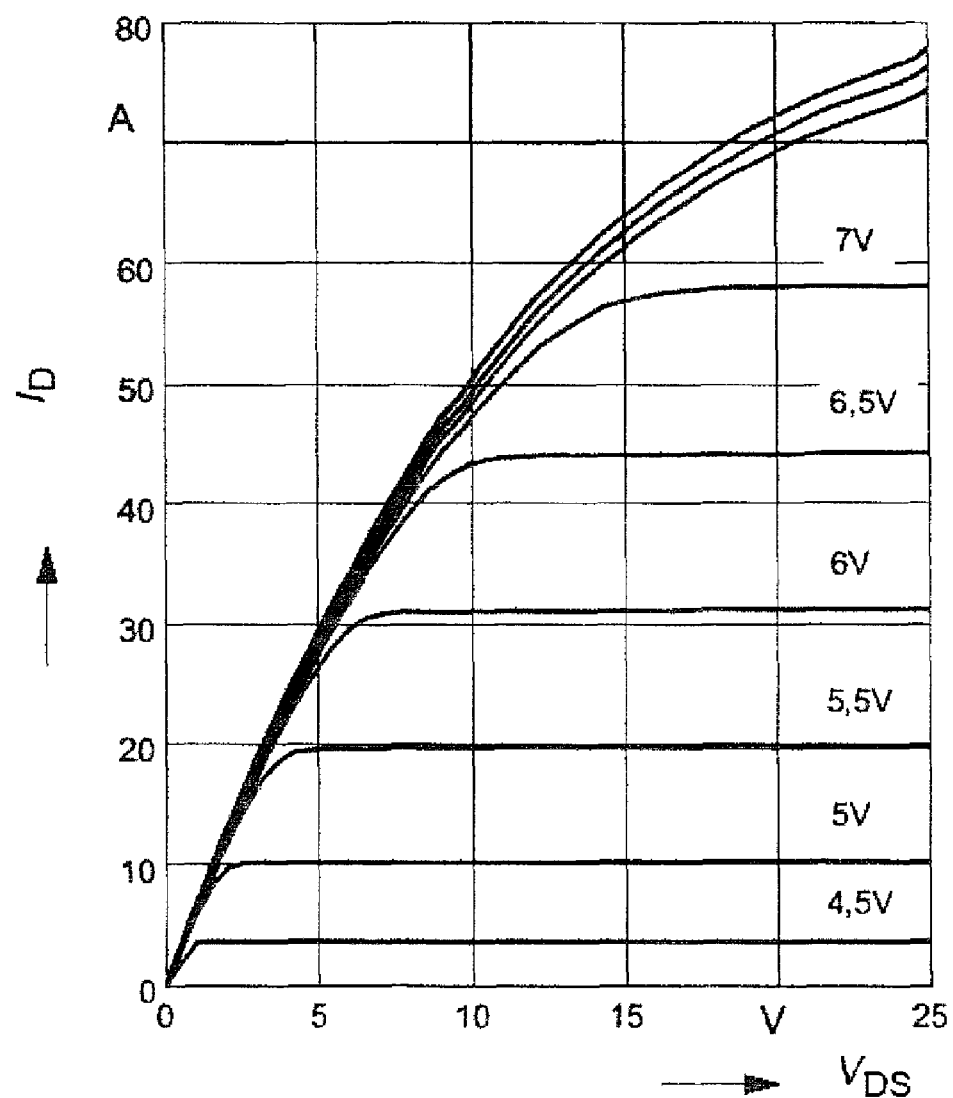
FIG. 5 shows the current-voltage characteristic of a switching device.

Generally, switching devices using MOSFET can bare approximately three to ten times the current rating for a short period. For example, as can be seen from FIG. 5 which shows the current-voltage characteristic of a MOSFET having a current rating of 20 A, a MOSFET can operate within the saturation region when the current is at 60 A. Therefore, a device having a maximum current rating that is approximately ⅓ of the switching device 211u and the switching device 212u can be used as the switching device 210u, which mainly performs the switching operation.

It is preferable that the switching devices 211u and 212u, which mainly perform the conduction operation, have a relatively large maximum current rating compared to the switching device 210u which mainly performs the switching operation. Regarding the switching devices 211u and 212u, it is not very necessary to consider the switching loss, and the maximum current rating of a switching device and conduction/switching loss have the relationship as described above. Therefore, in order to reduce the conduction loss, it is advantageous that the maximum current rating is low.

However, if the maximum current rating is unnecessarily high, it means that the chip area is large. This leads to increase in size of the apparatus. Hence, it is preferable that the maximum current rating is approximately twice to four times the maximum amount of current applied to the upper arm.

In the above, switching devices suitable for the conduction operation and the switching operation are described focusing on the relationship between the maximum current rating and the conduction loss and the switching loss. However, the upper limit of the maximum current rating may be determined not only by the current carrying capacity as the characteristic of the device, but also by the thermal resistance of the entire package. For example, when the switching device 210u and the switching devices 211u and 212u are all arranged on a single substrate and sealed with mold resin to form a single module, the maximum current rating is determined by the thermal resistance of the entire package. The maximum current rating determined by the thermal resistance of the entire package has essentially no correlation with the amounts of conduction loss and switching loss.

On the other hand, parasitic capacitance is determined by the properties of a switching device per se, and when the same material and the same structure are adopted in switching devices, parasitic capacitance and current carrying capacity generally correlate with each other in each switching device. That is, parasitic capacitance increases as the chip area increases. In other words, among switching devices made up from the same material and have the same structure, a switching device with a higher parasitic capacitance exhibits a smaller amount of conduction loss and a larger amount of switching loss. Therefore, which switching device is suitable for the conduction operation and which is for the switching operation can be determined based on the parasitic capacitance. Specifically, it is preferable that the switching devices 211u and 212u, which mainly perform the conduction operation, have a relatively large parasitic capacitance compared to the switching device 210u, which mainly performs the switching operation. In addition, a switching device increases its speed of performing the switching operation as the parasitic capacitance decreases. For this reason, there is a merit to select a switching device with a low parasitic capacitance as the switching device 210*u* which is required to perform the switching operation at high speed.

Note that the parasitic capacitance of a switching device is "input capacitance" occurring between a source and a gate, "output capacitance" occurring between a source and a drain, or "feedback capacitance" occurring between a drain and a gate. Generally, each type of capacitance is not determined independently, and when one of them is doubled, the other two are also approximately doubled. Therefore, switching devices to be used may be selected based on any type of capacitance.

Here, as described above, when the material and the structure of switching devices are the same, current carrying capacity and parasitic capacitance correlate with each other. However, when the material and the structure are different, there can be no correlation. For example, in a comparison between a switching device using silicon carbide (SiC) and a switching device using silicon (Si), the SiC device has a smaller chip area and a smaller parasitic capacitance even with the same current carrying capacity. Therefore, switching loss can be further reduced when a switching device 210*u* which mainly performs the switching operation is made up from a SiC device with low parasitic capacitance which can perform the switching operation at high speed.

Moreover, although SiC devices are costly, they have higher thermal resistance than Si devices. When the switching device 210*u*, the switching devices 211*u* and 212*u* are enclosed within a single package, the temperature of the entire package depends largely on heat generated by the switching devices 211*u* and 212*u* performing the conduction operation, and the temperature of the switching device 210*u* further rises locally when performing the switching operation. Considering the above, in the case the switching device 210*u* and the switching devices 211*u* and 212*u* are enclosed within a single package, it is preferable that Si devices, which are relatively cheap, are used as the switching devices 211*u* and 212*u*, and a SiC device, which has high thermal resistance, is used as the switching device 210*u* whose temperature temporarily rises when performing the switching operation.

Modification 1 of Embodiment 1

Figure 6:
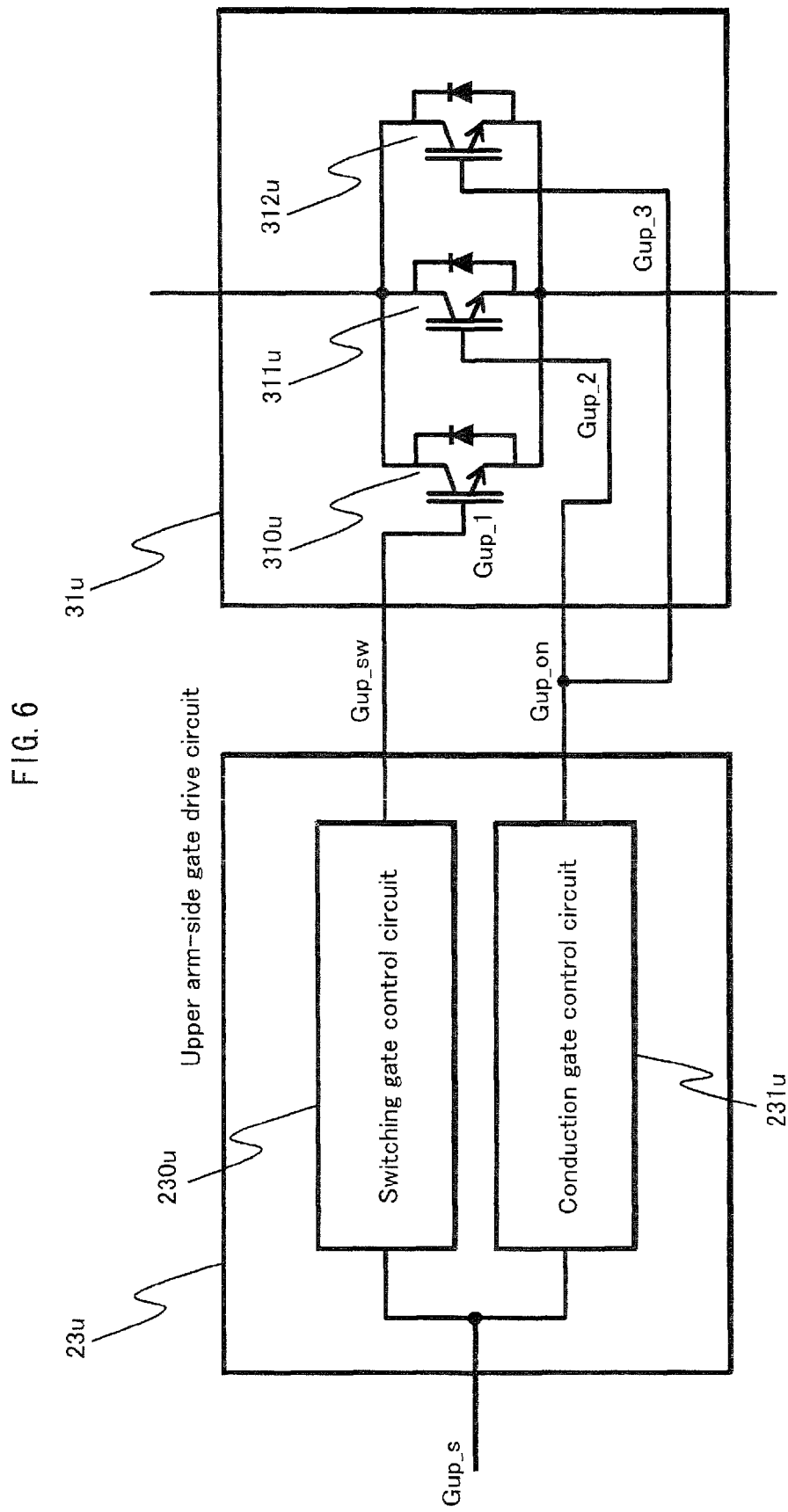
FIG. 6 shows detailed structures of a gate control circuit and an arm of an inverter pertaining to Modification 1 of Embodiment 1.

The example described above has s structure in which the upper arm 21*u* made up from a plurality of MOSFETs connected in parallel. However, the present invention is not limited to this. The switching devices may be insulated gate bipolar transistors (IGBTs), field effect transistors (J-FETs), bipolar transistors, or their combinations. FIG. 6 shows detailed structures of a gate control circuit and an arm of an inverter pertaining to Modification 1 of Embodiment 1. The structure shown in this figure is the same as the structure shown in FIG. 3 except that the upper arm 21*u* is replaced with an upper arm 31*u*, and performs the same operation. The upper arm 31*u* includes switching devices 310*u*, 311*u* and 312*u*, which are all IGBTs. As with Embodiment 1, when the switching devices are IGBTs, switching loss and conduction loss can be reduced separately. That is, both of them can be reduced, and this realizes a high-efficiency inverter.

Here, the present modification, in which the switching devices included in the upper arm are not MOSFETs but IGBTs, is advantageous when the conduction loss of the inverter is larger enough than the switching loss of the same.

Generally, MOSFETs have lower switching loss than IGBTs, but have higher conduction loss than IGBTs. Hence, when conduction loss is major among loss occurring in an inverter, it is advantages that the switching devices of the inverter to which the present invention is applied are IGBTs.

In the description of Embodiment 1 above, it is stated that when all the switching devices are MOSFETS, it is preferable that the switching device 210*u* which mainly performs the switching operation has a lower maximum current rating than the switching devices 211*u* and 212*u*. However, since IGBTs have higher switching loss and lower breakdown resistance than MOSFETs, the reliability of the inverter is degraded when the switching device which mainly performs the switching operation is made up from an IGBT and has low current carrying capacity (Generally, breakdown resistance and current carrying capacity have a trade-off relationship). Therefore, in the case of an inverter using IGBTs, it is preferable that the switching devices which mainly perform the switching operation are also made up from devices that have approximately the same current carrying capacity as the switching devices which mainly perform the conduction operation.

Modification 2 of Embodiment 1

Next, a modification in which the upper arm includes different types of switching devices is described.

Figure 7:
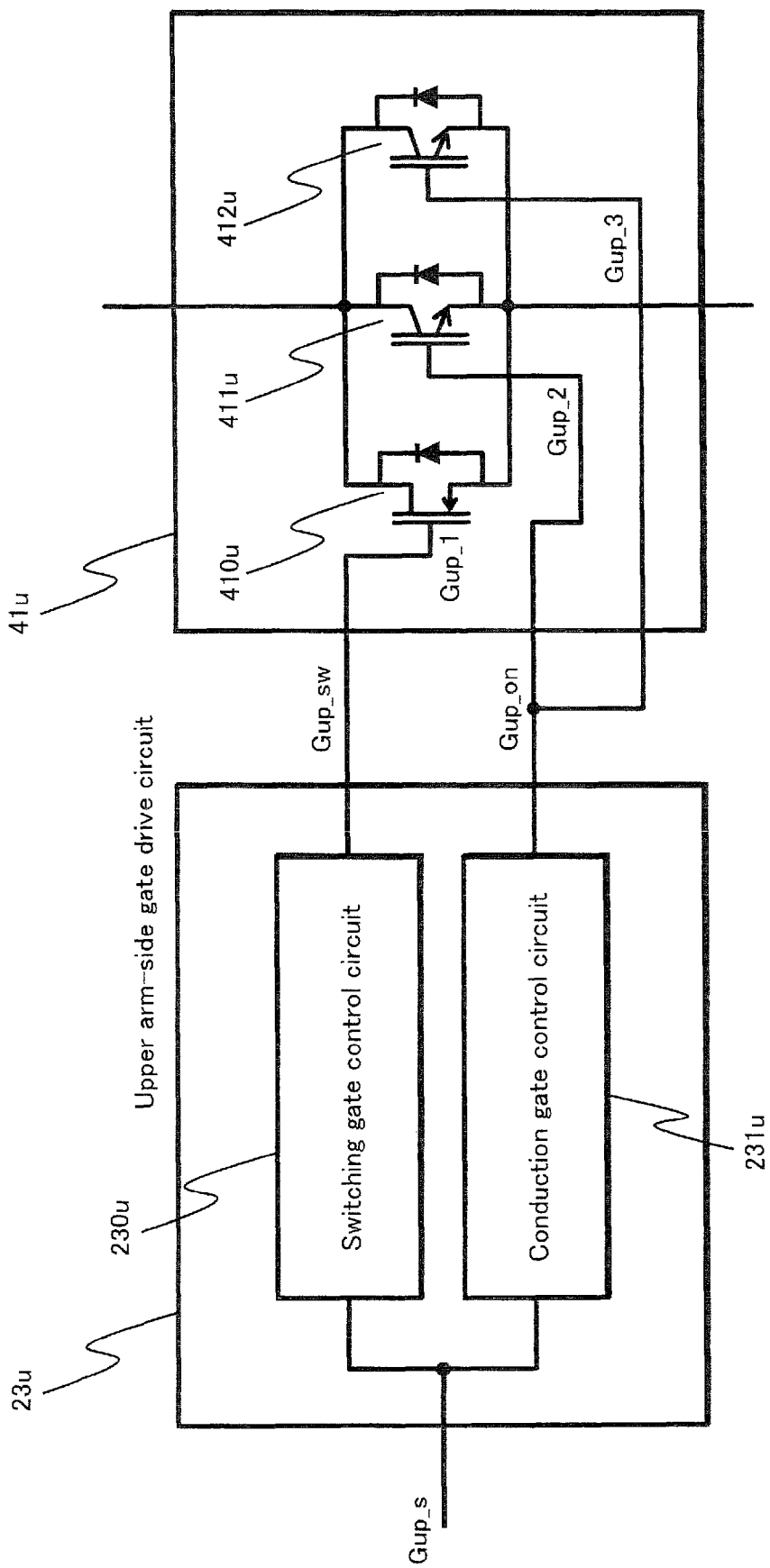
FIG. 7 shows detailed structures of a gate control circuit and an arm of an inverter pertaining to Modification 2 of Embodiment 1.

FIG. 7 shows detailed structures of a gate control circuit and an arm of an inverter pertaining to Modification 2 of Embodiment 1. The structure shown in this figure is the same as the structure shown in FIG. 3 except that the upper arm 21*u* is replaced with an upper arm 41*u*, and performs the same. The upper arm 41*u* includes switching devices 410*u*, 411*u* and 412*u*. The switching device 410*u* is a MOSFET, which is a unipolar device, and the switching devices 411*u* and 412*u* are IGBTs, which are bipolar devices.

In the present modification, as with Embodiment 1, switching loss and conduction loss can be reduced separately. That is, both of them can be reduced, and this realizes a high-efficiency inverter.

Generally, MOSFETs, which are unipolar devices, have a larger conductance resistance and a larger chip area than IGBTs, which are bipolar devices. Therefore, MOSFETs have higher conduction loss than IGBTs. On the other hand, since MOSFETs can perform the switching operation at higher speed than IGBTs, and can reduce the switching loss. Therefore, when the switching devices included in the upper arm are the combination of MOSFETs and IGBTs as with the present modification, that is, when the switching devices which mainly perform the switching operation are MOSFETs and the switching devices which mainly perform the conduction operation are IGBTs, the advantages of both switching devices can be maximized, and further effect of loss reduction can be achieved.

Modification 3 of Embodiment 1

The following describes another modification of Embodiment 1.

Figure 8:
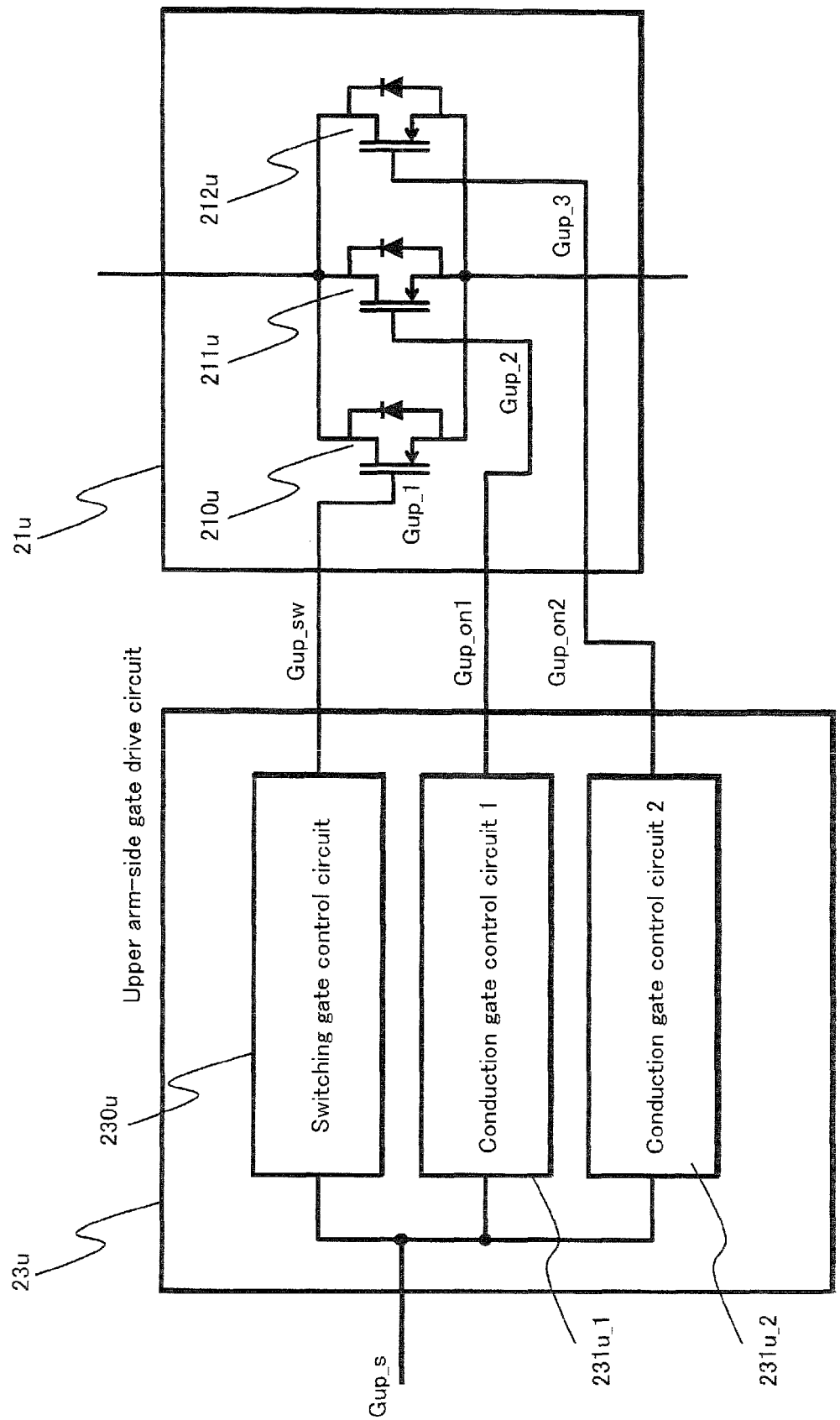
FIG. 8 shows detailed structures of a gate control circuit and an arm of an inverter pertaining to Modification 3 of Embodiment 1.

FIG. 8 shows detailed structures of a gate control circuit and an arm of an inverter pertaining to Modification 3 of Embodiment 1. The structure shown in the figure is different form FIG. 3 in that the conduction gate control circuit 231*u* of the upper arm-side gate drive circuit 21*u* is replaced with a conduction gate control circuit 231*u*_1 and a conduction gate control circuit 231*u*_2.

The upper arm-side gate drive circuit 23*u* includes the switching gate control circuit 230*u*, a conduction gate control circuit 231*u*_1 and a conduction gate control circuit 231*u*_2. The upper arm 21*u* includes three switching devices 210*u*, 211*u* and 212*u*. The switching gate drive circuit 230*u* is connected to the control terminal of the switching device 210*u*, and the conduction control circuits 231*u*_1 and 231*u*_2 are connected to the respective control terminals of the switching devices 211u and 212u. The switching devices 210u, 211u and 212u are connected in parallel, and their respective high electrical potential-side primary terminals are connected to one another, and their respective low electrical potential-side primary terminals are connected to one another.

The gate control signal Gup_s output from the control circuit 4 is input to each of the switching gate control circuit 230u and the conduction gate control circuits 231u_1 and 231u_2. Based on the gate control signal Gup_s, the switching gate control circuit 230u outputs a switching gate drive signal Gup_sw to the control terminal of the switching device 210u. The conduction gate control circuits 231u_1 and 231u_2 respectively output a conduction gate drive signals Gup_on1 and Gup_on2 to the control terminals of the switching devices 211u and 212u.

Figure 9:
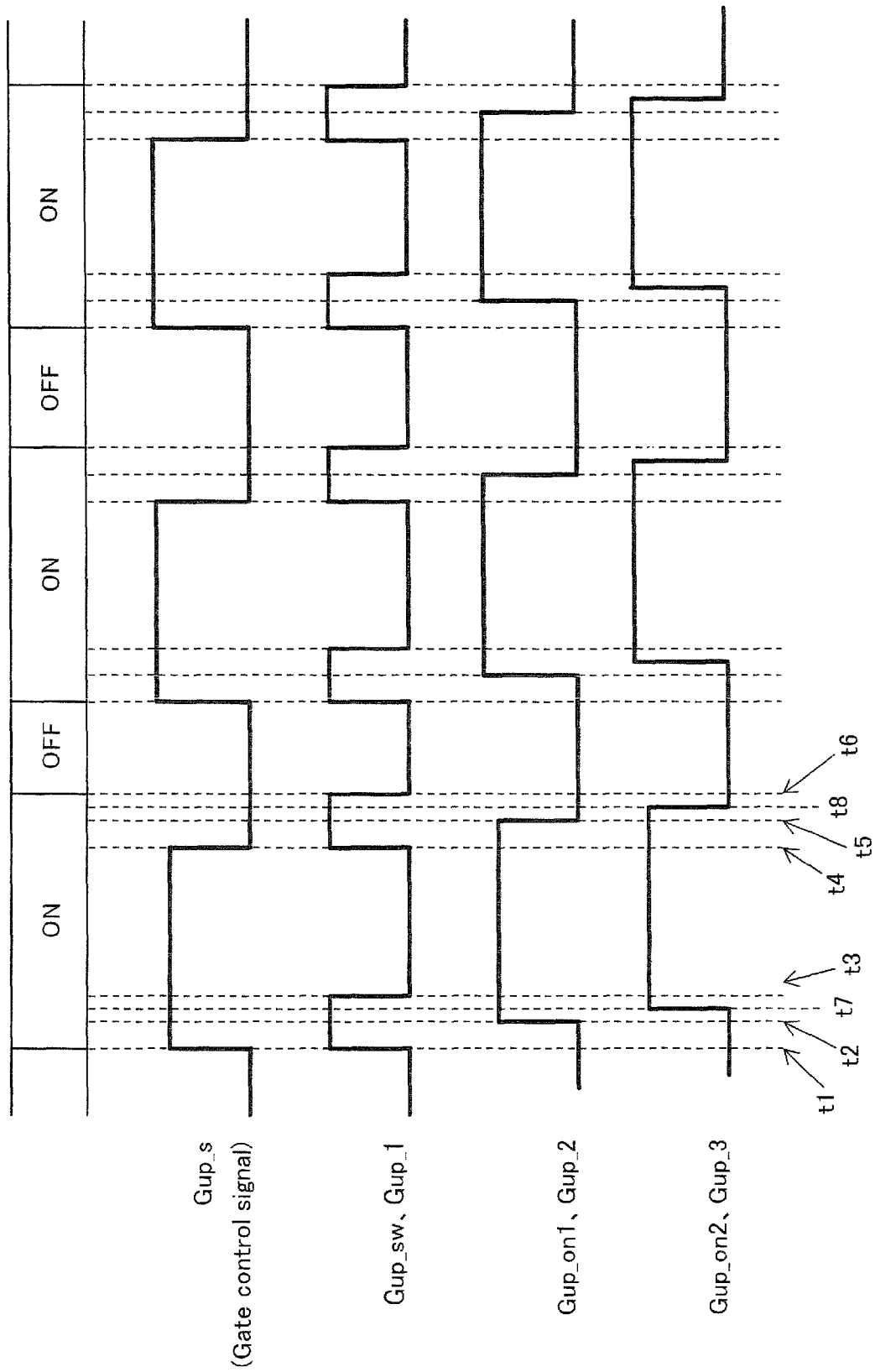
FIG. 9 is a timing chart illustrating operations performed by a gate control circuit pertaining to Modification 3.

The following describes the details of the switching gate drive signal Gup_sw output by the switching gate control circuit 230u and the conduction gate drive signals Gup_on1 and Gup_on2 respectively output by the conduction gate control circuits 231u_1 and 231u_2, with reference to FIG. 9.

The switching gate drive signal Gup_sw output by the switching gate control circuit 230u is the same as the example shown in FIG. 4. The conduction gate drive signal Gup_on1 output by the conduction gate control circuit 231u_1 is the same as the conduction gate drive signal Gup_on shown in FIG. 4.

The conduction gate control circuit 231u_2, which is newly added to the present modification, raises the conduction gate drive signal Gup_on2 at time t7 in the period of one cycle of the gate control signal Gup_s. The time t7 indicates a point within the period between t1 and t3 for which the switching gate drive signal Gup_sw is raised to the High level along with the rise of the gate control signal Gup_s. Then, the conduction gate control circuit 231u_2 drops the conduction gate drive signal Gup_on2 at time t8. The time t8 indicates a point within the period between t4 and t6 for which the switching gate drive signal Gup_sw is raised to the High level along with the drop of the gate control signal Gup_s.

Here, either one of the conduction gate control signal Gup_on1 or Gup_on2 may be raised prior to the other as long as it is raised in the period between t1 and t3, and they may be raised at the same time. Similarly, either one of the conduction gate control signal Gup_on1 or Gup_on2 may be dropped prior to the other as along as it is dropped in the period between t4 and t6, and they may be dropped at the same time.

With the structure of the present modification, the switching operation is performed by the switching device 210u, and the conduction operation is performed by the switching devices 211u and 212u. Thus, with the stated structure of the upper arm 21u, as with the structure shown in FIG. 3, the location where switching loss occurs and the location where conduction loss occurs can be separated.

Furthermore, since the same number of conduction gate control circuits as the switching devices which perform the conduction operation are provided and each switching device is driven by different one of the gate control circuits, the amount of current for the gate drive signal is smaller than in the structure shown in FIG. 3, and drive loss occurring in the upper arm-side gate drive circuit 21u is smaller.

Also, since each switching device is driven by a different gate control circuit, each switching device can be controlled according to its properties, and this makes it easy to increase the amount of current and output power of the inverter. Moreover, since each switching device can be controlled according to its state, it is possible to control a high-temperature switching device to reduce losses in the device, for example. Specifically, by lowering the gate drive voltage applied to a high-temperature switching device, it is possible to reduce the output current from the switching device and reduce losses.

Modification 4 of Embodiment 1

The following describes yet another modification of Embodiment 1.

Figure 10:
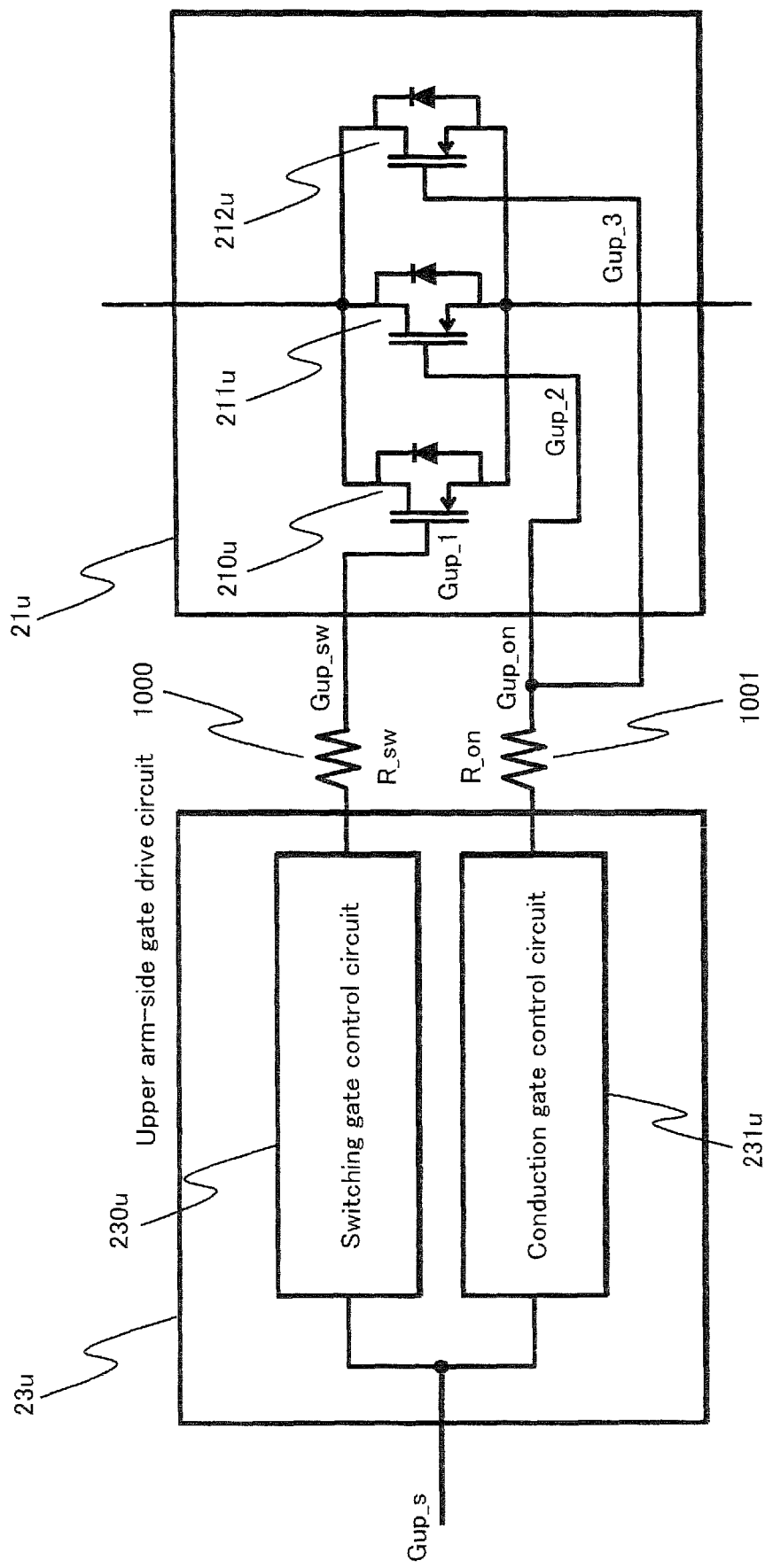
FIG. 10 shows detailed structures of a gate control circuit and an arm of an inverter pertaining to Modification 4 of Embodiment 1.

FIG. 10 shows detailed structures of a gate control circuit and an arm of an inverter pertaining to Modification 4 of Embodiment 1. The structure shown in this figure is different from the structure shown in FIG. 3 in that the control terminals of the switching gate control circuit 230u and the switching device 210u are connected via a switching gate resistor 1000, and the control terminals of the conduction gate control circuit 231u and the switching devices 211u and 212u are connected via a conduction gate resistor 1001.

Here, the resistance value of the switching gate resistor 1000 is smaller enough than the conduction gate resistor 1001.

With this structure, the electrical potential of the control terminal of the switching device 210u which performs the switching operation can be immediately changed to the potential for turning ON, and thus the structure realizes a switching operation with reduced switching losses. Furthermore, since the control terminals of the switching devices 211u and 212u which perform the conduction operation are prevented from receiving excessive electrical field stress, it is possible to improve the reliability of the switching devices 211u and 212u. Furthermore, the amount of current for the gate drive signal can be reduced, and accordingly the drive loss occurring in the upper arm-side gate drive circuit 21u can be reduced.

Furthermore, the present modification achieves an effect of suppressing malfunctions occurring when dv/dt is high. Since the switching devices which mainly perform the switching operation perform the switching operation at a higher speed than the switching devices which mainly perform the conduction operation, they have a smaller parasitic capacitance. Therefore, the switching devices which mainly perform the switching operation are susceptible to disturbance and often cause malfunction.

Figure 11:
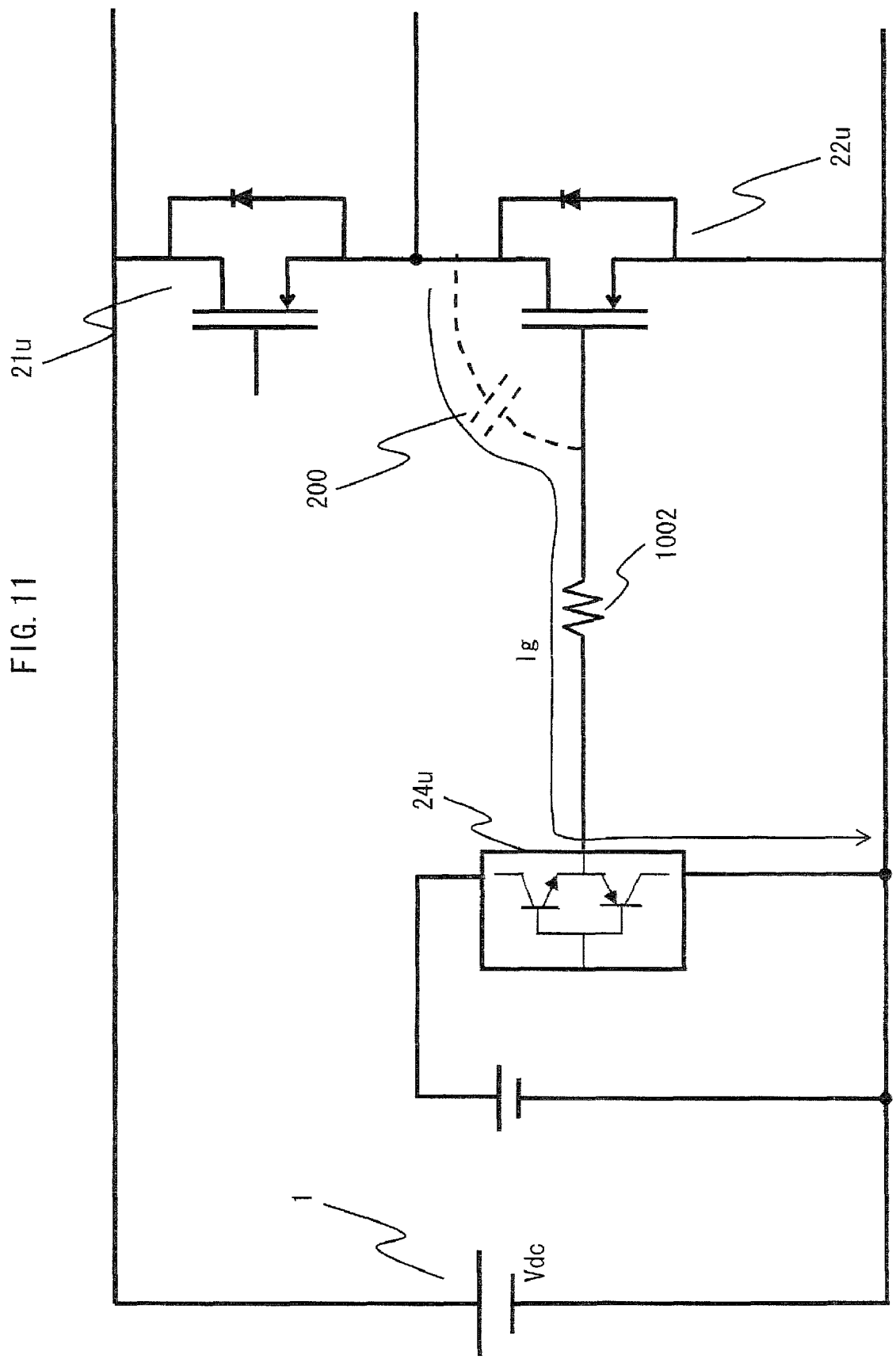
FIG. 11 illustrates mechanism by which a lower arm $22u$ malfunctions due to a turning on of a upper arm $21u$.

FIG. 11 illustrates mechanism by which the lower arm 22u malfunctions due to turning on of the upper arm 21u. Generally, the switching devices in the inverter alternately turn on the upper arm 21u and the lower arm 22u so that the upper arm 21u and the lower arm 22u do not cause short circuit, and a pause (usually called "dead time") for which both the upper arm 21u and the lower arm 22u are turned off is interposed. When the upper arm 21u is turned on after the pause, a DC voltage Vdc from the battery 1 is applied between the drain and the source of the lower arm 22u. At this moment, the parasitic capacitance 200 of the lower arm 22u is rapidly charged according to the switching speed of the upper arm 21u, and current Ig flows via a gate resistor 1002 and the arm drive circuit 24u connected to the gate terminal of the lower arm 22u. Due to the flow of the current Ig, potential difference occurs between the ends of the gate resistor 1002 according to the resistance value of the gate resistor 1002. Here, when the parasitic capacitance between the drain and the gate of the lower arm 22u is Cgd and the gate resistor 1002 is Rg, the potential difference occurring between the ends of the gate resistor 1002, namely potential difference Vgs between the gate and the source of the lower arm 22u, can be represented by the following formula.

$$Vgs = Rg \times Cgd \times (dVdc/dt)$$

That is, Vgs increases as the resistance Rg of the gate resistor 1002 which determines the switching speed of the lower arm 22u increases, or the parasitic capacitance Cgd of the lower arm 22u increases, or the switching time dVdc/dt of the upper arm 21u increases, and accordingly the lower arm 22u will be likely to malfunction.

The parasitic capacitance Cgd of the lower arm 22u is determined according to the internal structure of the lower arm 22u, and cannot be changed freely. Also, if the switching time dVdc/dt of the upper arm 21u at turning on is decreased, the switching speed of the upper arm 21u decreases, and the switching loss increases. Thus, it is not preferable to change the switching time dVdc/dt.

With the present modification, however, by reducing the gate resistor connected to the control terminal of the switching devices that perform the switching operation, high-speed switching is realized and the combined resistance between the gate terminal of the lower arm 22u and the arm drive circuit 24u is reduced. Thus, malfunctions due to high dv/dt can be suppressed.

Embodiment 2

Figure 12:
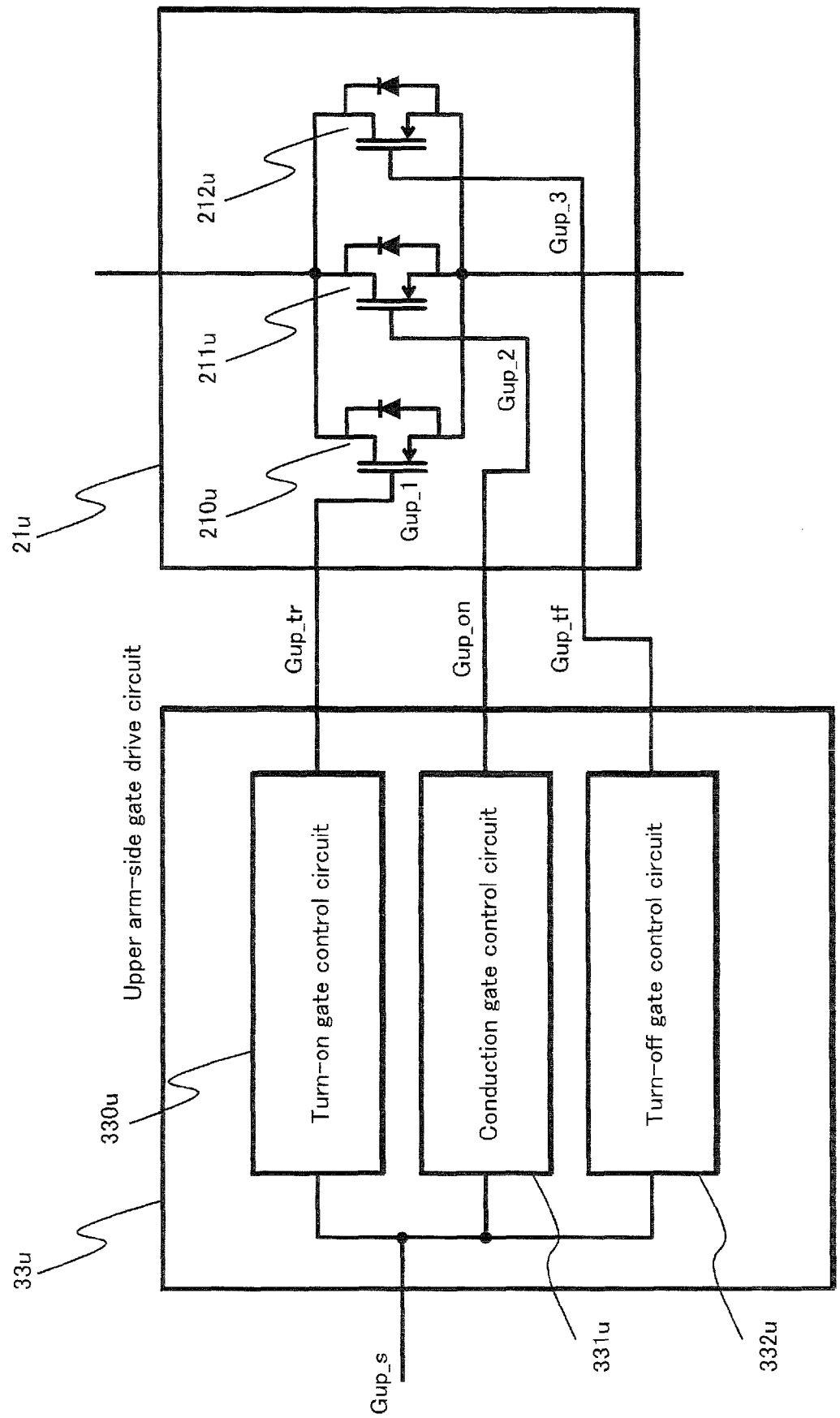
FIG. 12 shows detailed structures of a gate control circuit and an arm of an inverter pertaining to Embodiment 2.

FIG. 12 shows detailed structures of a gate control circuit and an arm of an inverter pertaining to Embodiment 2 The structure shown in the figure is different form FIG. 3 in that the upper arm-side gate drive circuit 23u is replaced with an upper arm-side gate drive circuit 33u.

The upper arm-side gate drive circuit 33u includes a turn-on gate control circuit 330u, a conduction gate control circuit 331u, and a turn-off gate control circuit 332u. The upper arm 21u includes three switching devices 210u, 211u and 212u. The turn-on gate drive circuit 330u is connected to the control terminal of the switching device 210u, and the conduction gate control circuit 331u is connected to the control terminal of the switching device 211u, and the turn-off gate drive circuit 332u is connected to the control terminal of the switching device 212u. The switching devices 210u, 211u and 212u are connected in parallel, and their respective high potential-side primary terminals are connected to one another, and their respective low potential-side primary terminals are connected to one another.

The gate control signal Gup_s output from the control circuit 4 is input to each of the turn-on gate control circuit 330u, the conduction gate control circuit 331u, and the turn-off gate control circuit 332u. Based on the gate control signal Gup_s, the turn-on gate control circuit 330u outputs a turn-one gate drive signal Gup_tr to the control terminal of the switching device 210u. Similarly, the conduction gate control circuit 331u outputs a conduction gate drive signal Gup_on to the control terminal of the switching device 211u, and the turn-off gate control circuit 332u outputs a turn-off gate drive signal Gup_tf to the control terminal of the switching device 212u.

Figure 13:
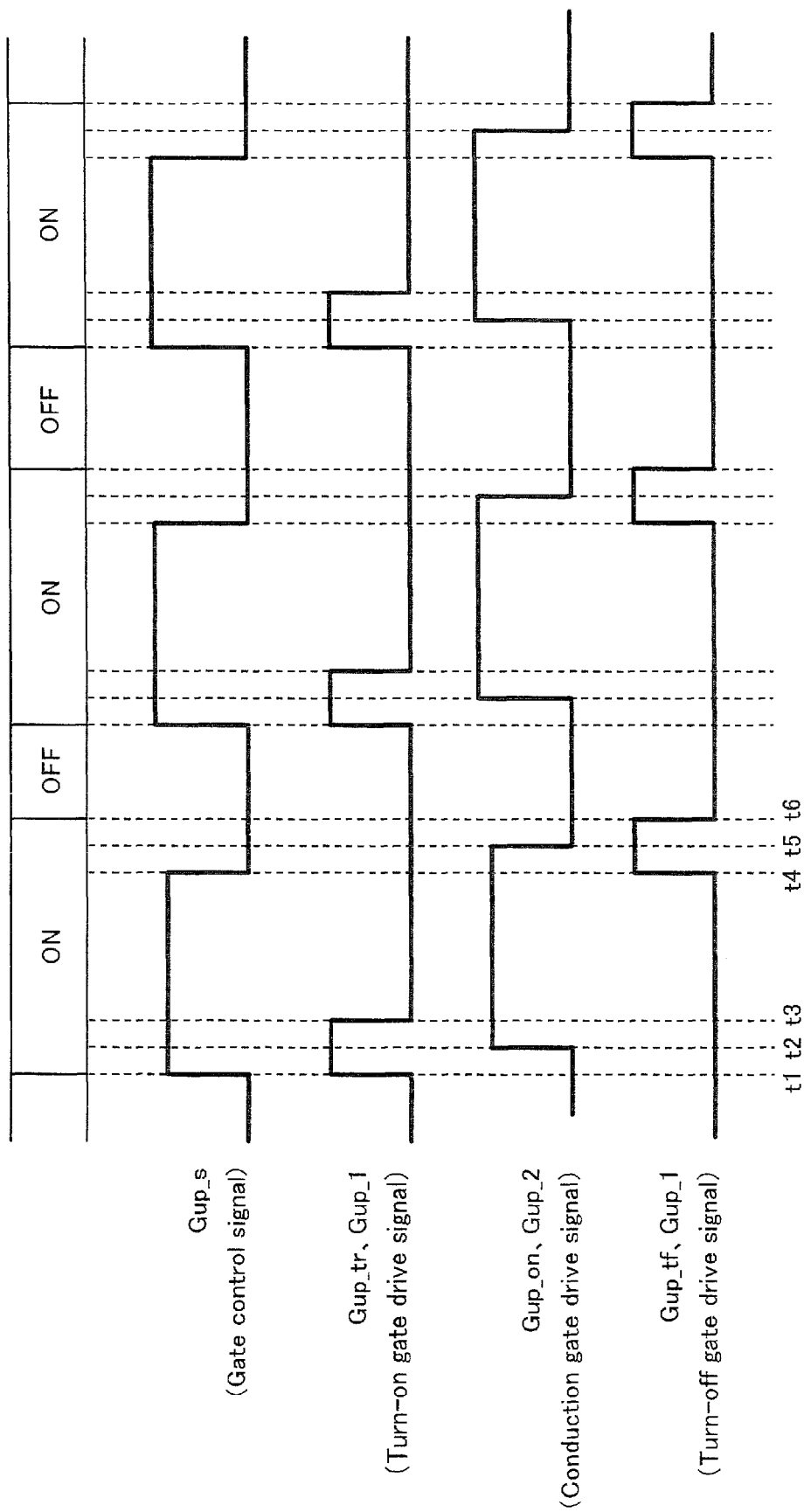
FIG. 13 is a timing chart illustrating operations performed by a gate control circuit of an inverter pertaining to Embodiment 2.

The following describes the details of the turn-on gate drive signal Gup_tr output by the turn-on gate control circuit 330u, the conduction gate drive signal Gup_on output by the conduction gate control circuit 331u, and the turn-off gate drive signal Gup_tf output by the turn-off gate control circuit 332u, with reference to FIG. 13.

The turn-on gate control circuit 330u raises the turn-on gate drive signal Gup_tr at time t1, which is when a rise is detected in the gate control signal Gup_s input by the control circuit 4. Then, the turn-on gate control circuit 330u drops the turn-on gate drive signal Gup_tr within a shorter period than the first-potential period for which the electrical potential of the gate control signal Gup_s is at the High level. That is, the turn-on gate control circuit 330u drops the turn-on gate drive signal Gup_tr at time t3.

The turn-off gate control circuit 332u raises the turn-off gate drive signal Gup_tf at time t4, which is when a drop is detected in the gate control signal Gup_s. Then, the turn-off gate control circuit 332u drops the switching gate drive signal Gup_tf within a shorter period than the second-potential period for which the electrical potential of the gate control signal Gup_s is at the Low level. That is, the turn-off gate control circuit 332u drops the switching gate drive signal Gup_tf at time t6.

The conduction gate control circuit 331u raises the conduction gate drive signal Gup_on at time t2. The time t2 is a point within the period between t1 and t3 for which the turn-on gate drive signal Gup_tr is raised to the High level. After that, the conduction gate control circuit 331u drops the conduction gate drive signal Gup_on at time t5. The time t5 is a point within the period between t4 and t6 for which the turn-off gate drive signal Gup_tf is raised to the High level.

Through the operations described above, each of the gate control circuits, namely the turn-on gate control circuit 330u, the conduction gate control circuit 331u and the turn-off gate control circuit 332u, outputs, as a gate drive signal, square wave once within the period of one cycle of the gate control signal Gup_s.

With such operations, turning on in switching is performed by the switching device 210u, conduction is performed by the switching device 211u and turning off in switching is performed by the switching device 212u. As a result, losses occurring in the upper arm 21u can be separated into turn-on losses, conduction losses, and turn-off losses. Therefore, switching loss (the sum of turn-on loss and turn-off loss) and conduction loss, which conventionally have a trade-off relationship, can be reduced separately. That is, both of them can be reduced, and this realizes a high-efficiency inverter.

Note that the switching devices which constitute the upper arm and are connected in parallel do not necessarily have the same threshold voltage. Generally, threshold voltage has a relationship with the on-resistance (a characteristic of a switching a device, which is a primary cause of conduction loss), and on-resistance decreases as threshold voltage decreases. Therefore, even more efficient inverter can be realized by making up the upper arm from switching devices having different threshold voltages according to their respective operations.

Specifically, in comparison between a switching device performing the turn-on operation and a switching device performing the conduction operation, it is preferable that the switching device performing the conduction operation has a lower threshold voltage than the switching device performing the turn-on operation. With such a structure, the conduction operation will be performed by a switching device having a low on-resistance.

In comparison between a switching device performing the turn-on operation and a switching device performing the turn-off operation, it is preferable that the switching device performing the turn-off operation has a higher threshold voltage than the switching device performing the turn-on operation. With such a structure, when turning on is performed, the switching device operates at a relatively low threshold voltage, and this increases the speed of the turning on. Also, when turning off is performed, the switching device operates at a relatively high threshold voltage, and this increases the speed of the turning off. Therefore, switching loss can be further reduced.

Switching devices are more likely to malfunction when performing the switching operation than when performing the conduction operation, and are also more likely to malfunction when the potential difference between the on-voltage and the off-voltage of the switching device is smaller. Hence, in the structure shown in FIG. 3, it is preferable that the potential difference between the on-voltage and the off-voltage output by the switching gate control circuit 230u is set to be larger than the potential difference between the on-voltage and the off-voltage output by the conduction gate control circuit 231u. With such a structure, malfunctions in switching can be suppressed. In the case of the structures shown in FIG. 12, it is preferable that the potential difference between the on-voltage and the off-voltage increases in the following order: the turn-on gate control circuit 330u, the conduction gate control circuit 331u and the turn-off gate control circuit 332u. As the on/off potential difference of the turn-on gate control circuit 330u is large, the switching device is unlikely to malfunction, and as the on/off potential difference of the turn-off gate control circuit 332u is small, the turning on can be performed at high speed.

Embodiment 3

Figure 14:
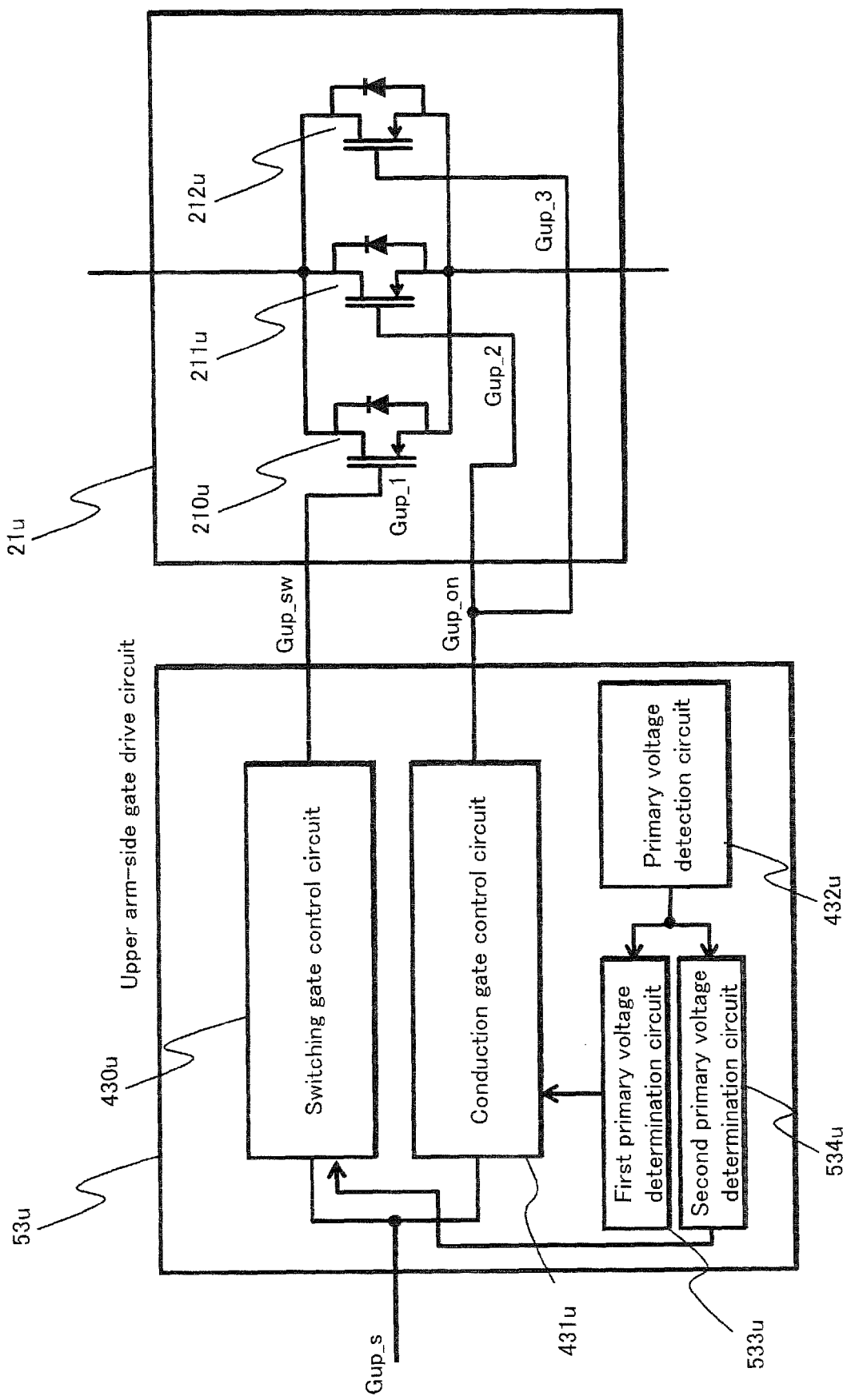
FIG. 14 shows detailed structures of a gate control circuit and an arm of an inverter pertaining to Embodiment 3.

FIG. 14 shows detailed structures of a gate control circuit and an arm of an inverter pertaining to Embodiment 3

The upper arm-side gate drive circuit 53u includes a switching gate control circuit 430u, a conduction gate control circuit 431u, a primary voltage detection circuit 432u, a first primary voltage determination circuit 533u, and a second primary voltage determination circuit 534u. The upper arm 21u includes three switching devices 210u, 211u and 212u.

The switching gate drive circuit 430u is connected to the control terminal of the switching device 210u, and the conduction gate control circuit 431u is connected to the respective control terminals of the switching devices 211u and 212u. The switching devices 210u, 211u and 212u are connected in parallel, and their respective high potential-side primary terminals are connected to one another, and their respective low potential-side primary terminals are connected to one another.

The upper arm-side gate drive circuit 53u includes the primary voltage detection circuit 432u, the first primary voltage determination circuit 533u and the second primary voltage determination circuit 534u in addition to the components of the upper arm-side gate drive circuit 23u shown in FIG. 3. The following describes specific operations of only the primary voltage detection circuit 432u, the first primary voltage determination circuit 533u and the second primary voltage determination circuit 534u, which are different from the structure shown in FIG. 3.

The primary voltage detection circuit 432u detects the primary voltage, which is the voltage between the primary terminals of the upper arm 21u, and outputs a detection signal corresponding to the primary voltage of the upper arm to the first primary voltage determination circuit 533u and the second primary voltage determination circuit 534u.

Figure 15:
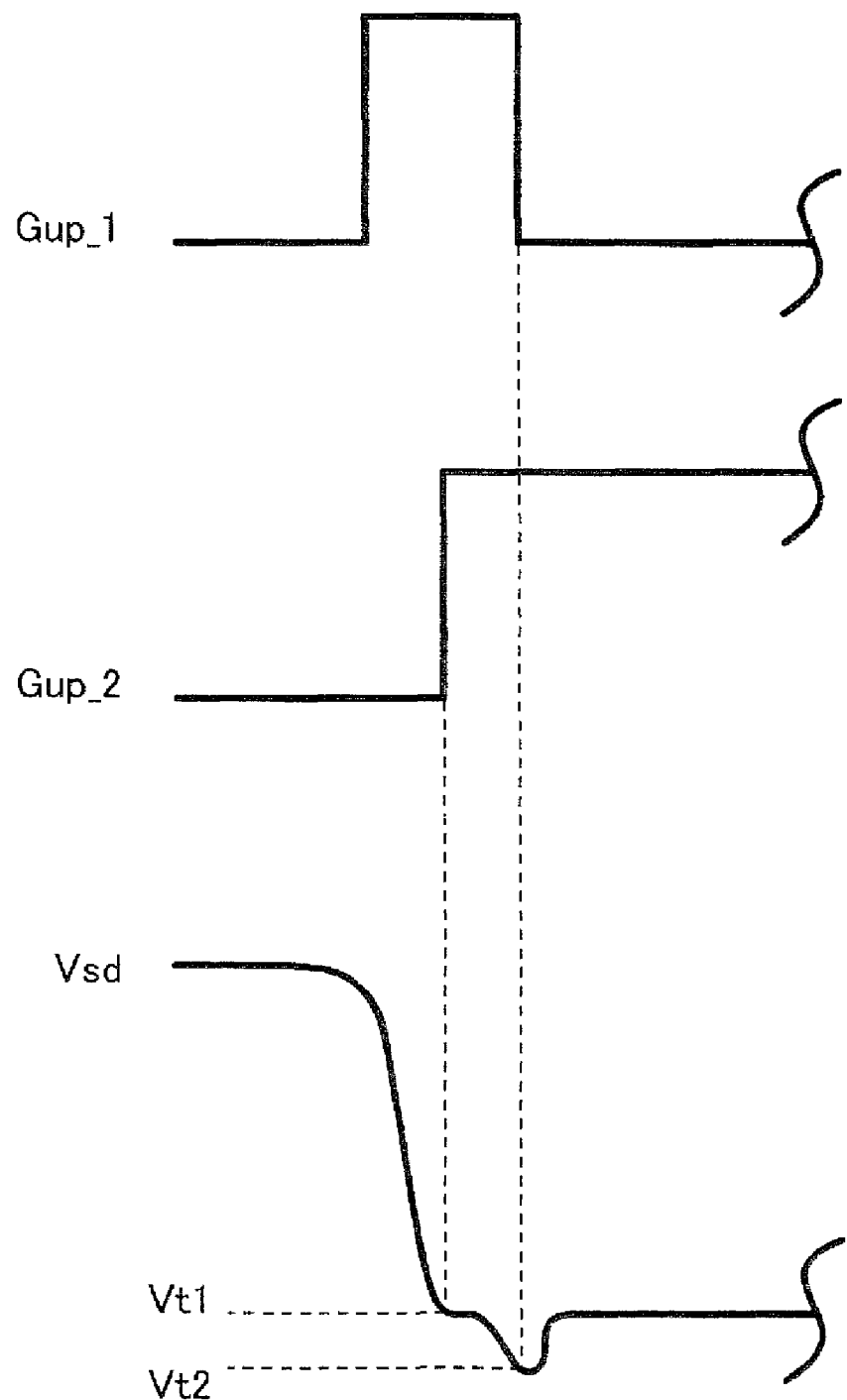
FIG. 15 shows operations of gate control circuit in an inverter pertaining to Embodiment 3 and switching operations thereof.

The first primary voltage determination circuit 533u, upon receipt of the detection signal, compares the input signal with a predetermined voltage Vt1, and when it is lower than the predetermined voltage Vt1, the first primary voltage determination circuit 533u outputs a first determination signal to the conduction gate control circuit. Here, the predetermined voltage Vt1 is, as shown in FIG. 15, the voltage under that condition that the switching operation performed by the switching device 210u according to the switching gate drive signal Gup_sw has been completed. Specifically, Vt1 is the on-voltage of the switching device 210u performing the switching operation.

With such a structure, the switching device 210u performing the switching operation detects that the switching has been completed, and the switching devices 211u and 212u performing the conduction operation are turned on. Thus, the period between the completion of the switching performed by the switching device 210u and the start of the conduction can be shortened. Therefore, this structure realizes quick switching between the operations, without putting excessive load on the switching device 210u performing the switching operation.

The second primary voltage determination circuit 534u, upon receipt of the detection signal, compares the input signal with a predetermined voltage Vt2, and when it is lower than the predetermined voltage Vt2, the second primary voltage determination circuit 534u outputs a second determination signal to the switching gate control circuit. Here, the predetermined voltage Vt2 is, as shown in FIG. 15, the voltage under the condition that both the switching operation performed by the switching device 210u according to the switching gate drive signal Gup_sw and the conduction operation performed by the switching devices 211u and 212u according to the conduction gate drive signal Gup_on have been completed. Specifically, Vt2 is the on-voltage at which the switching device performing the switching operation and the switching devices performing the conduction operation are all turned on. The second primary voltage determination circuit 534u therefore functions as a switching completion primary voltage determination circuit which determines whether the voltage has the value at which the conduction of the switching device 210u that performs the switching operation is to be stopped.

With this structure, the switching device 210u performing the switching operation is turned off at detection of the completion of the conduction operation performed by the switching devices 211u and 212u performing the conduction operation. Therefore, the structure realizes quick switching between the operations, without putting excessive load on the switching device 210u performing the switching operation.

Modification of Embodiment 3

In Embodiment 3 described above, the gate control is performed by using the voltage between the primary terminals of the switching devices. Alternatively, it is possible to use the primary current flowing between the primary terminals of the switching devices.

Figure 16:
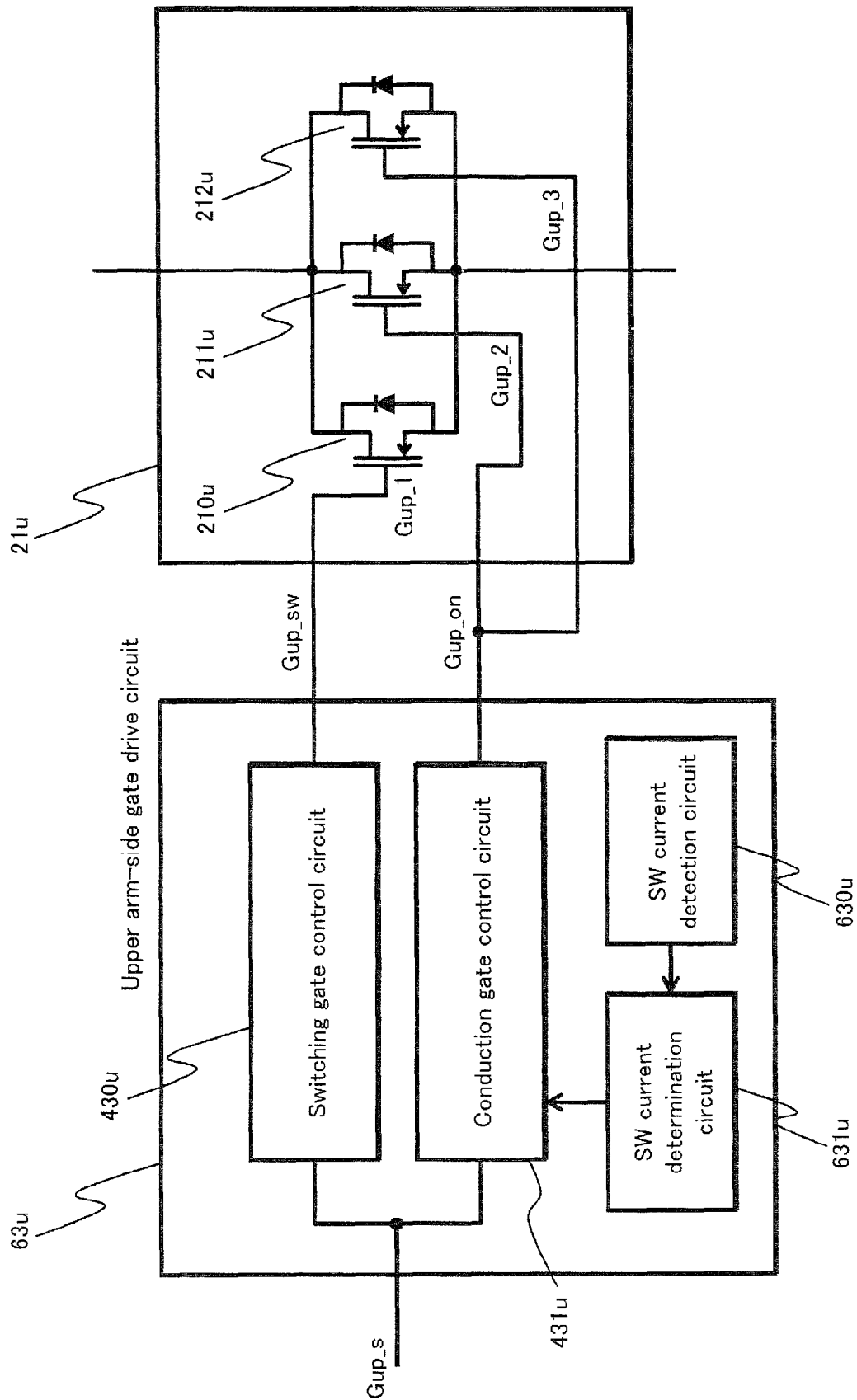
FIG. 16 shows detailed structures of a gate control circuit and an arm of an inverter pertaining to Embodiment 3.

FIG. 16 shows detailed structures of a gate control circuit and an arm of an inverter pertaining to Modification of Embodiment 3.

The upper arm-side gate drive circuit 63u includes a switching gate control circuit 430u, a conduction gate control circuit 431u, a switching current detection circuit (SW current detection circuit) 630u and a switching current determination circuit (SW current determination circuit 631u). The upper arm 21u includes three switching devices 210u, 211u and 212u. The switching gate drive circuit 430u is connected to the control terminal of the switching device 210u, and the conduction gate control circuit 431u is connected to the respective control terminals of the switching devices 211u and 212u. The switching devices 210u, 211u and 212u are connected in parallel, and their respective high potential-side primary terminals are connected to one another, and their respective low potential-side primary terminals are connected to one another.

The upper arm-side gate drive circuit 63u includes the switching current detection circuit 630u and the switching current determination circuit 631u in addition to the components of the upper arm-side gate drive circuit 23u. The following describes specific operations of only the switching current detection circuit 630u and the switching current determination circuit 631u.

The switching current detection circuit 630u detects the primary current of the switching device 21u performing the switching operation, and outputs a detection signal corresponding to the value of the primary current of the switching device 210$u$ to the switching current determination circuit 631$u$. The detection signal can be easily handled if it is generated by converting the amount of the current to a voltage value, for example.

The switching current determination circuit 631$u$, upon receipt of the detection signal, compares the input with a predetermined voltage, and when it is higher than the predetermined voltage, the switching current determination circuit 631$u$ outputs a determination signal to the conduction gate control circuit. Here, the predetermined voltage is the voltage at the end of the switching. Specifically, the predetermine voltage depends on the amount of the current to be applied by the upper arm.

With this structure, the switching devices 211$u$ and 212$u$ performing the conduction operation is turned on at detection of the completion of the switching operation performed by the switching device 210$u$ performing the switching operation. Therefore, the structure realizes quick switching between the operations, without putting excessive load on the switching device 210$u$ performing the switching operation.

Embodiment 4

Figure 17:
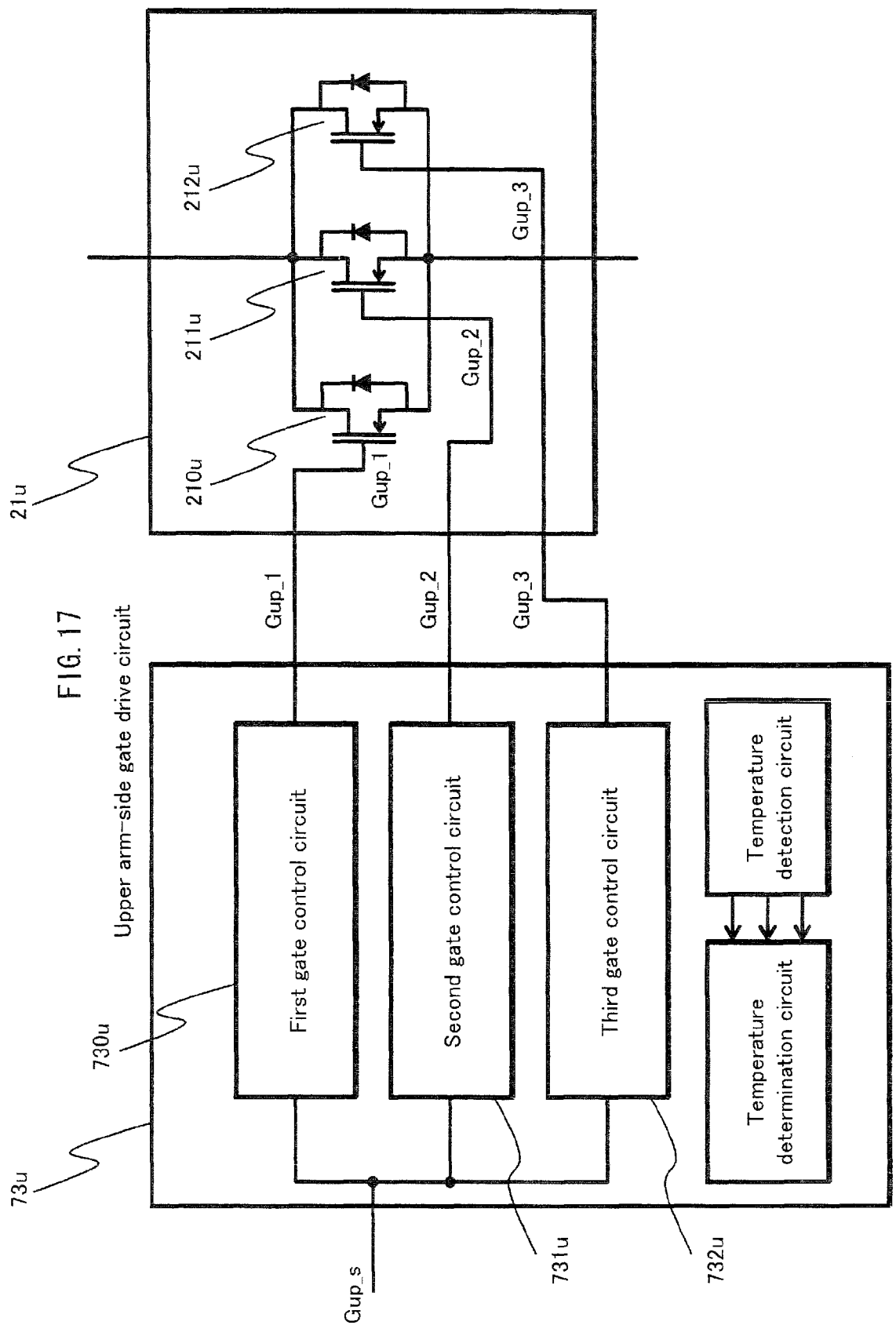
FIG. 17 shows detailed structures of a gate control circuit and an arm of an inverter pertaining to Embodiment 4.

FIG. 17 shows detailed structures of a gate control circuit and an arm of an inverter pertaining to Embodiment 4.

The upper arm-side gate drive circuit 73$u$ includes a first gate control circuit 730$u$, a second gate control circuit 731$u$, a third gate control circuit 732$u$, a temperature detection circuit 733$u$ and a temperature determination circuit 734$u$. The upper arm 21$u$ includes three switching devices 210$u$, 211$u$ and 212$u$. The first gate drive circuit 730$u$ is connected to the control terminal of the switching device 210$u$. The second gate control circuit 731$u$ is connected to the control terminal of the switching device 211$u$. The third gate control circuit 732$u$ is connected to the control terminal of the switching device 212$u$. The switching devices 210$u$, 211$u$ and 212$u$ are connected in parallel, and their respective high potential-side primary terminals are connected to one another, and their respective low potential-side primary terminals are connected to one another.

The following explains specific operations. The temperature detection circuit 733$u$ detects the temperatures of the switching device 210$u$, 211$u$ and 212$u$ (specifically, the junction temperatures of the chips constituting the switching devices), and outputs detection signals respectively corresponding to the temperatures of the switching devices 210$u$, 211$u$ and 212$u$ to the temperature determination circuit 734$u$.

The temperature determination circuit 734$u$, upon receipt of the detection signals, compares the temperatures of the switching devices 210$u$, 211$u$ and 212$u$. The temperature determination circuit 734$u$ causes the gate control circuit connected to the control terminal of the switching device with the lowest temperature to perform the same operation as the switching gate control circuit 230$u$ described above with reference to FIG. 3. With respect to the gate control circuits connected to the control terminals of the other switching devices, the temperature determination circuit 734$u$ causes them to perform the same operation as the conduction gate control circuit 231$u$ described above with reference to FIG. 3.

It is generally known that the values of avalanche resistance and short circuit capacity, which indicate the reliability of a switching device, are significantly decreased with increased temperature of the switching device.

Hence, as described above, the switching device with the lowest temperature among the switching devices 210$u$, 211$u$ and 212$u$ included in the upper arm 21$u$ is caused to perform the switching operation, so that the avalanche resistance and the short circuit capacity of the upper arm 21$u$ can be maintained at relatively high levels. This leads to an inverter with high efficiency and high efficiency.

Note that when the switching devices connected in parallel have the same electrical properties, the switching devices show almost no difference in temperature rise due to the switching. Hence, if this is the case, the switching devices perform the switching in turn without considering the temperatures.

With such a structure, the number of switching operations performed by each of the switching devices connected in parallel can be averaged, and this prevents switching load from being concentrated to a particular switching device. Therefore, the stated structure contributes to extension of the life spans of the switching devices.

Embodiment 5

Figure 18:
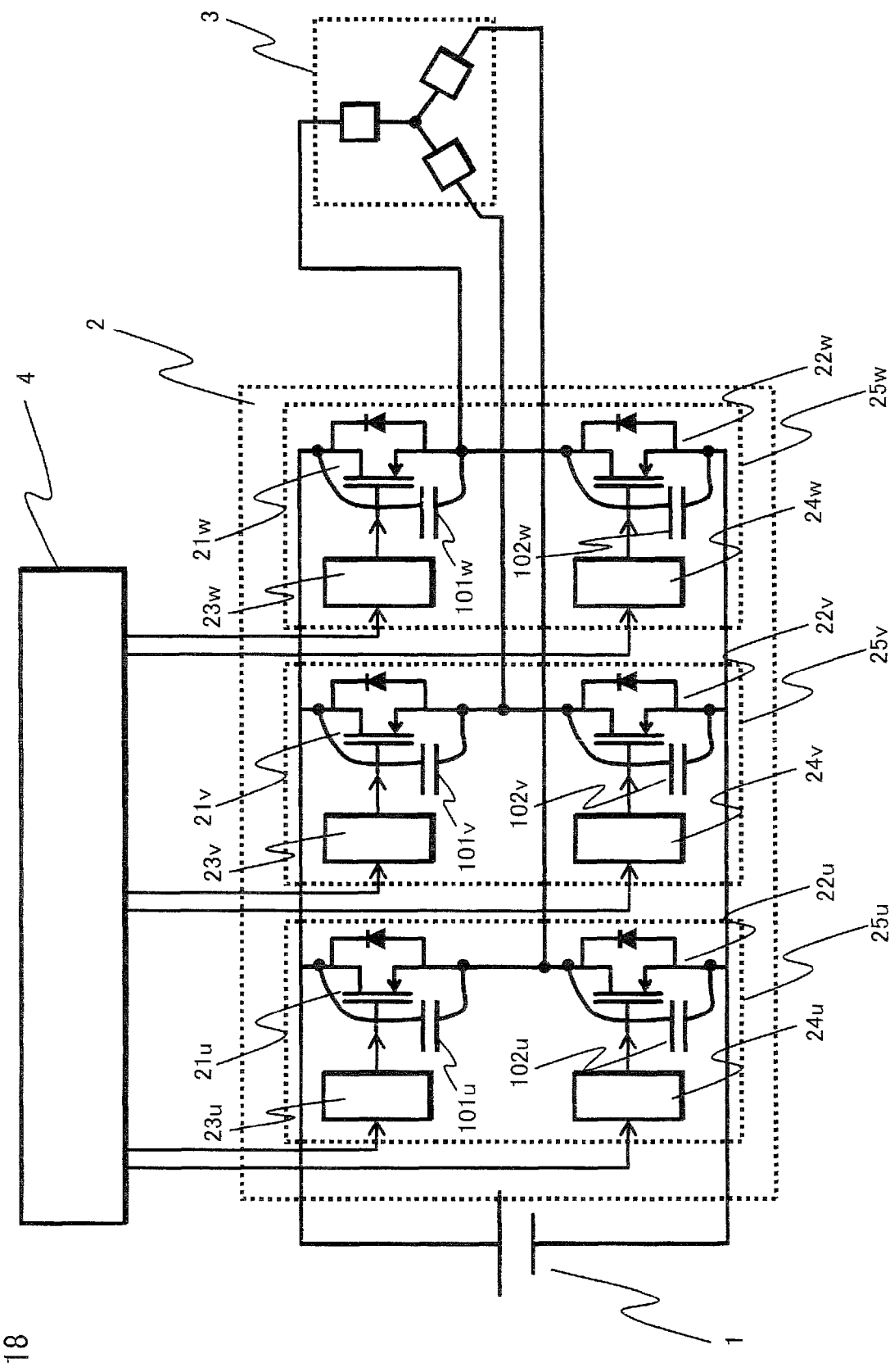
FIG. 18 shows the entire structure of a synchronous motor drive system using an inverter pertaining to Embodiment 5.

FIG. 18 shows the entire structure of a synchronous motor drive system using an inverter pertaining to Embodiment 5. The following explains an example in which MOSFETs are used as the switching devices.

An inverter 2 pertaining to the present embodiment includes the same number of legs as the outputs of AC power, namely legs 25$u$, 25$v$ and 25$w$. The legs 25$u$, 25$v$ and 25$w$ respectively include: upper arms 21$u$, 21$v$ and 21$w$ and lower arms 22$um$ 22$v$ and 22$w$, which are connected in series between the positive terminal and the negative terminal of the batter 1 (the upper arms are connected to the positive side, and the lower arms are connected to the negative side); capacitors 101$u$, 101$v$, 101$w$, 102$u$, 102$v$ and 102$w$, which are connected to the upper arms 21$u$, 21$v$ and 21$w$ and the lower arms 22$u$, 22$v$ and 22$w$; and upper arm-side gate drive circuits (upper arm drive circuits) 23$u$, 23$v$ and 23$w$ and lower arm-side gate drive circuits (lower arm drive circuits) 24$u$, 24$v$ and 24$w$, which correspond to the upper arms 21$u$, 21$v$ and 21$w$ and the lower arms 22$u$, 22$v$ and 22$w$ The capacitors 101$u$, 101$v$, 101$w$, 102$u$, 102$v$ and 102$w$ are respectively connected in parallel to and are respectively adjacent to the upper arms 21$u$, 21$v$ and 21$w$ and the lower arms 22$u$, 22$v$ and 22$w$.

Figure 19:
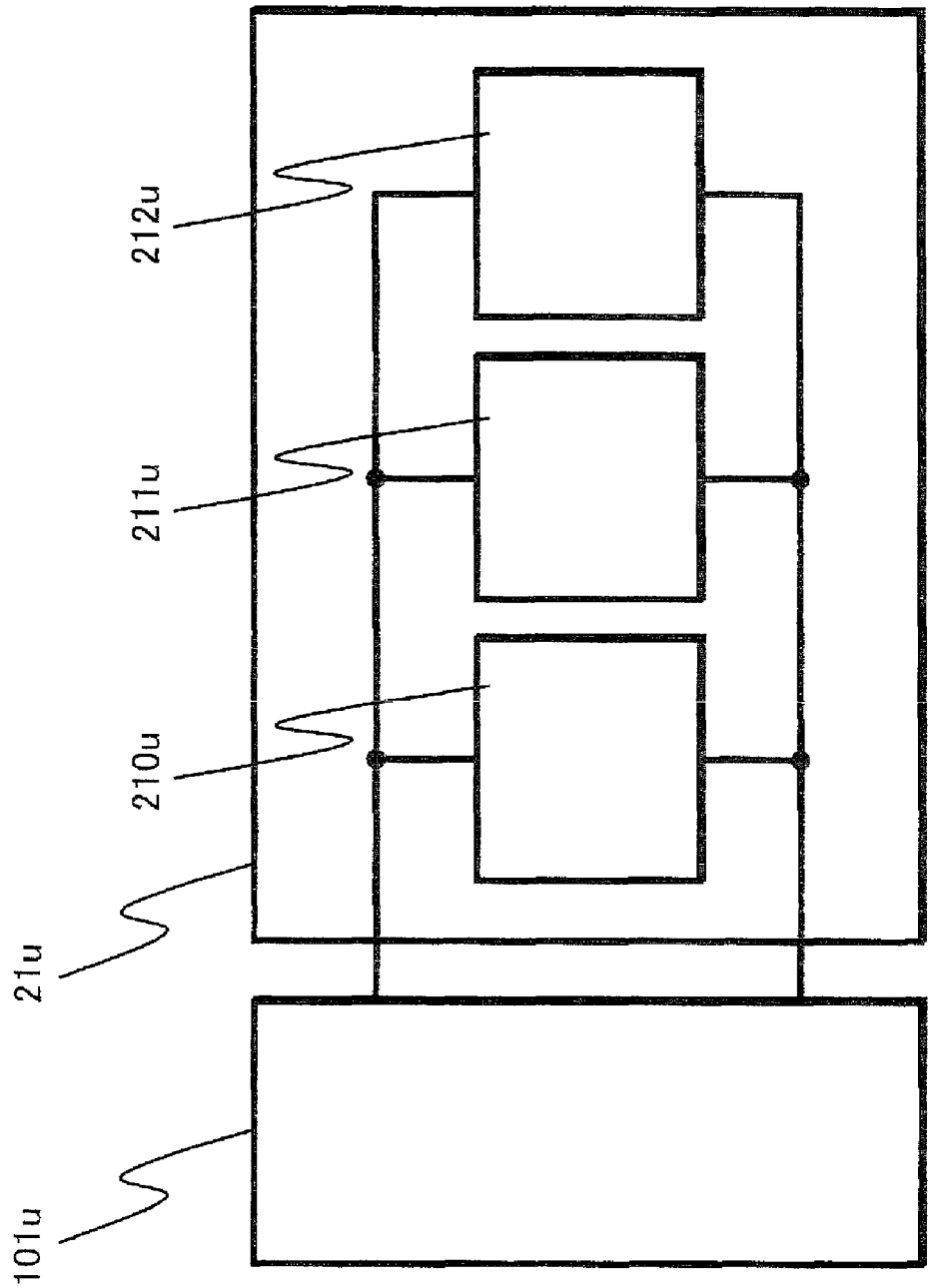
FIG. 19 shows a positional relationship between an arm and a capacitor of the inverter pertaining to Embodiment 5.

FIG. 19 schematically shows a positional relationship between the switching devices included in the upper arm 21$u$ and the capacitor 101$u$. The upper arm 21$u$ and the capacitor 101$u$ are adjacent to each other. In particular, among the switching devices 210$u$, 211$u$ and 212$u$ included in the upper arm 21$u$, the switching device 210$u$ performing the switching operation is the closest to the capacitor 101$u$.

With this structure, considering the wiring inductance of each of the capacitor 101$u$ and the switching devices 210$u$, 211$u$ and 212$u$, the wiring between the capacitor 101$u$ and the switching device 210$u$ performing the switching operation can be the shortest. The structure therefore suppresses surge voltage, which occurs when the switching device 210$u$ performs the switching operation at high speed. This leads to an inverter with high efficiency and high efficiency.

Embodiment 6

Figure 20:
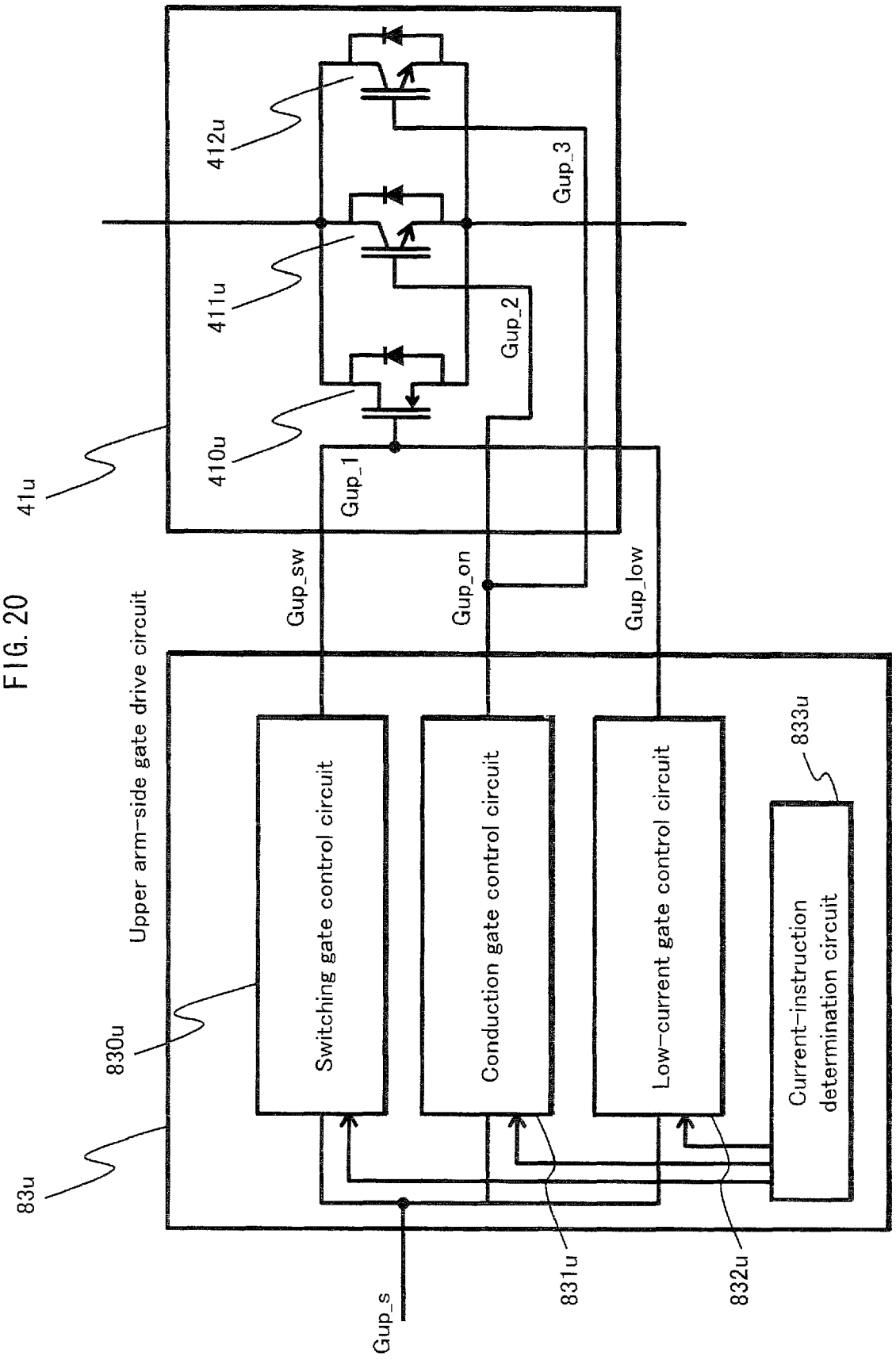
FIG. 20 shows detailed structures of a gate control circuit and an arm of an inverter pertaining to Embodiment 6.

FIG. 20 shows detailed structures of a gate control circuit and an arm of an inverter pertaining to Embodiment 6.

In the present embodiment, an upper arm-side gate drive circuit 83$u$ includes a switching gate control circuit 830$u$, a conduction gate control circuit 831$u$, a low-current gate control circuit 832$u$, and a current-instruction determination circuit 833$u$. The upper arm 41$u$ includes switching devices 410$u$, 411$u$ and 412$u$. The switching device 410$u$ is a MOSFET, and the switching devices 411$u$ and 412$u$ are IGBTs.

The switching gate control circuit 830$u$ and the conduction gate control circuit 831$u$ have the same structure as the switching gate control circuit 230u and the conduction gate control circuit 231u shown in FIG. 3.

The low-current gate control circuit 832u a low-current gate drive signal Gup_low, which have the same waveform as the gate control signal Gup_s output by the control circuit 4, to the control terminal of the switching device 410u.

The current-instruction determination circuit 833u monitors a current-instruction signal Is_u input to the control circuit 4. When the current-instruction signal Is_u indicates that the inverter is instructed to drive with current falling within a rage where MOSFETs require a lower voltage than IGBTs to obtain a desired current value, the current-instruction determination circuit 833u instructs the low-current gate control circuit 832u to output a gate drive signal. When the current-instruction signal Is_u indicates that the inverter is instructed to drive with current falling within a range where IGBTs require a lower voltage than MOSFETs to obtain a desired current value, the current-instruction determination circuit 833u instructs the switching gate control circuit 830u and the conduction gate control circuit 831u to output a gate drive signal.

Figure 21:
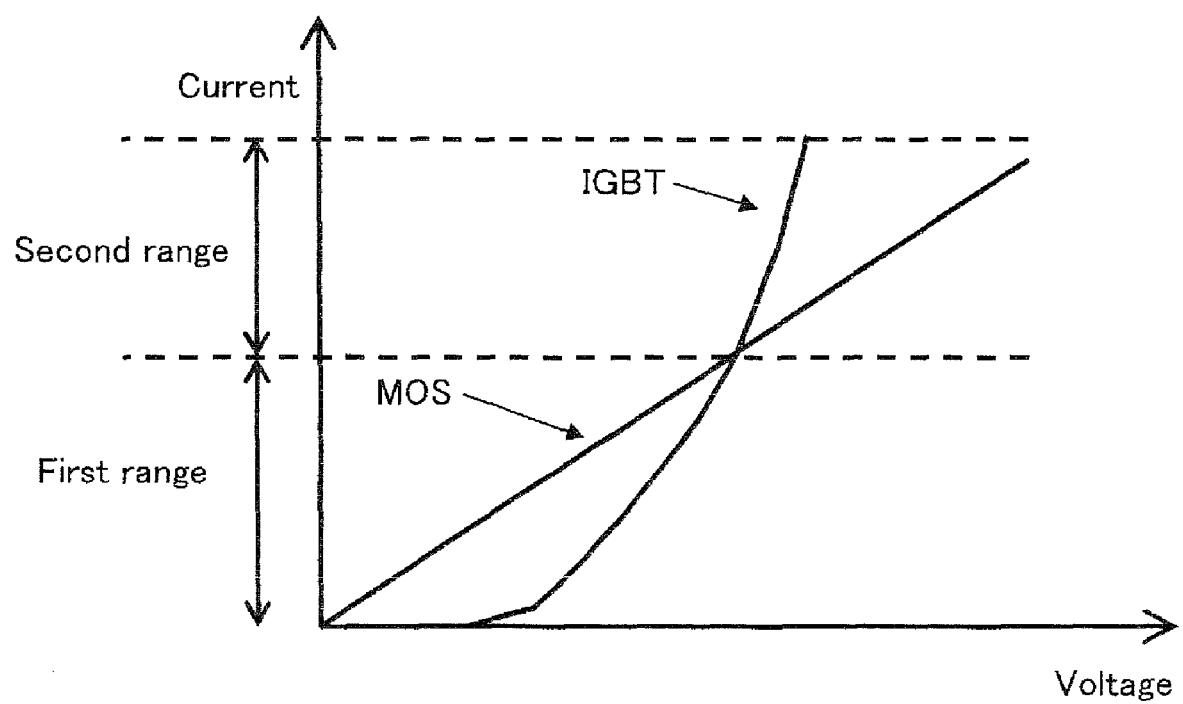
FIG. 21 compares voltage-current characteristics in saturation regions of IGBT and MOSFET.

Generally, voltage-current characteristics in saturation regions of IGBT and MOSFET have the relationship as shown in FIG. 21. Within the first range shown in the drawing, MOSFET requires lower voltage than IGBT to obtain a desired current value. Therefore, when the same current is applied, the loss is lower in MOSFET. In contrast, within the second range, IGBT requires lower voltage than MOSFET to obtain a desired current value. Therefore, the loss is lower in IGBT.

With the stated structure, as with Embodiment 1, the switching loss and the conduction loss occurring while the inverter operates with a current falling within the second range shown in FIG. 21 can be separated according to the gate drive signals output by the switching gate control circuit 830u and the conduction gate control circuit 831u. On the other hand, with a current falling within the first range shown in FIG. 21, the inverter operates only with the switching devices made up from MOSFETs with lower losses, according to the low-current gate drive signal Gup_low output by the low-current gate control circuit 832u.

Other Modifications

The inverter pertaining to the present invention has been described above based on Embodiments. However, the present invention is not limited to Embodiments. For example, the following modifications may be applied.

(1) In each embodiment, a three-phase inverter is taken as an example. However, the present invention is applicable to any power converter in which arms are composed of a plurality of switching devices connected in parallel.

For example, the present invention is applicable to DC/DC converters including arms composed of a plurality of switching devices.

Figure 22:
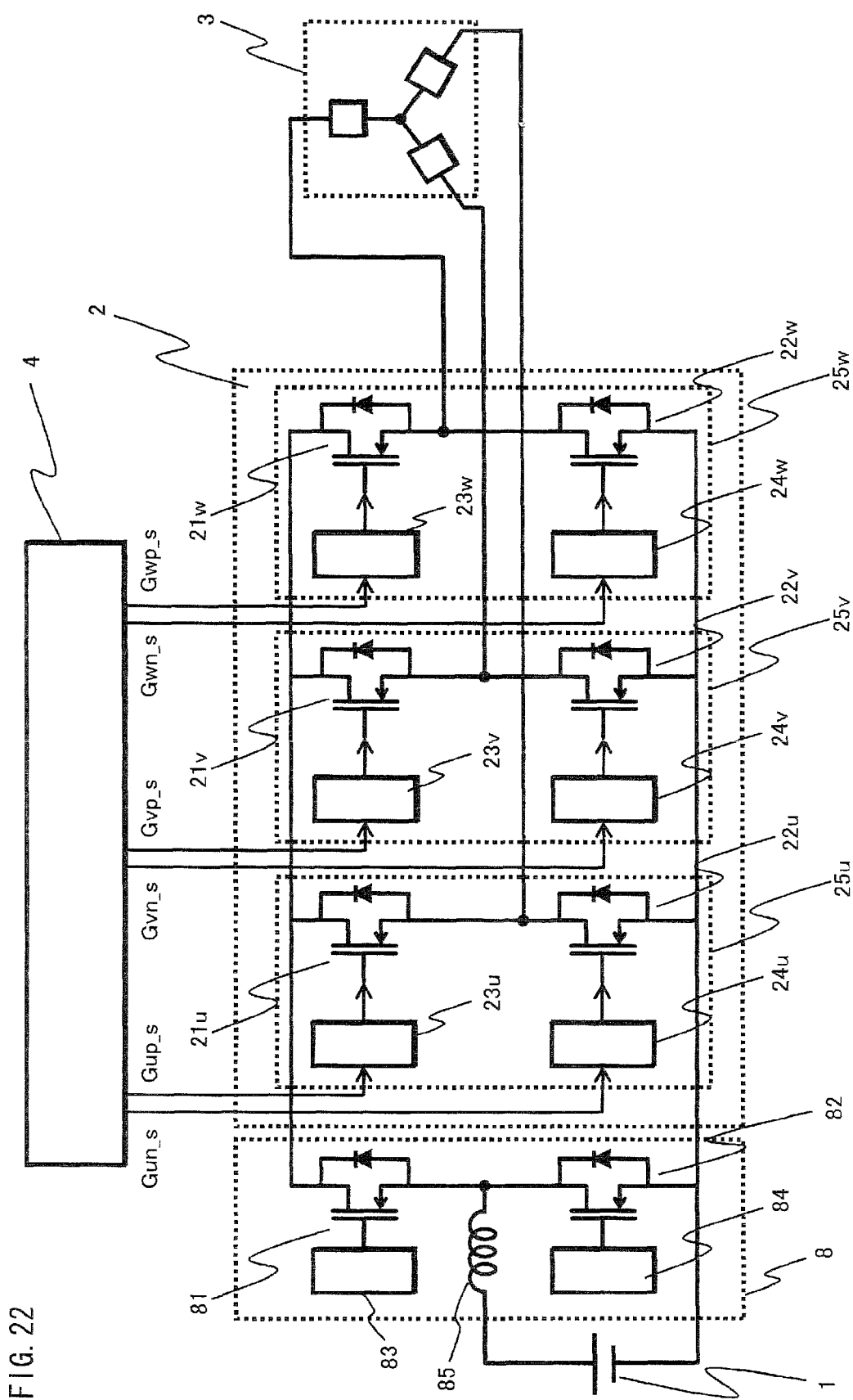
FIG. 22 shows the entire structure of a synchronous motor drive system using a DC/DC converter pertaining to the present invention.

FIG. 22 is a modification of the synchronous motor drive system shown in FIG. 1 in which a DC/DC converter 8 is added.

The DC/DC converter 8 includes an arm 81, an arm 82, a gate drive circuit 83, a gate drive circuit 84 and an inductor 85. The gate drive circuit 83 and the gate drive circuit 84 correspond to the arm 81 and the arm 82, respectively.

Figure 23:
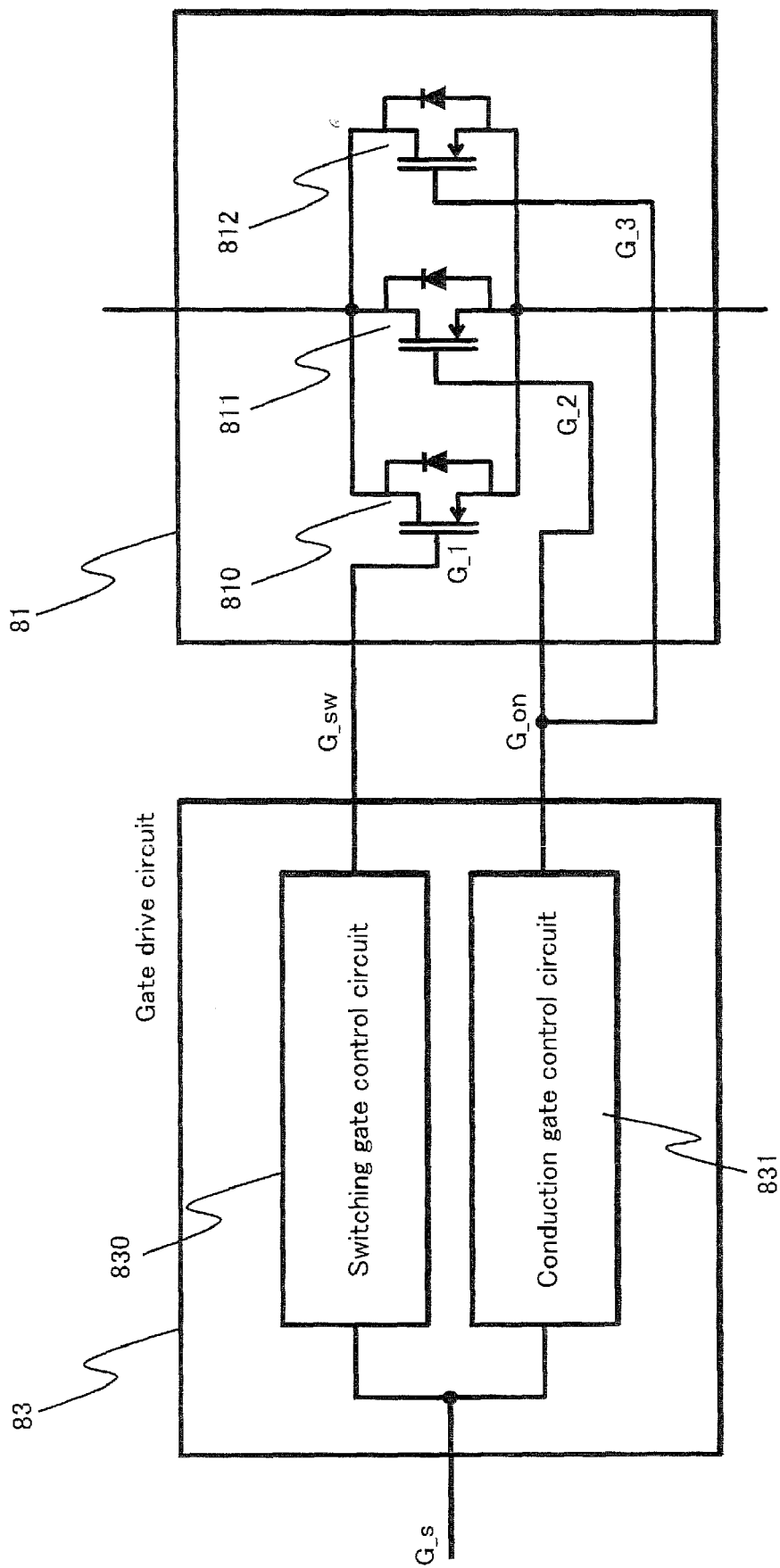
FIG. 23 shows detailed structures of an arm 81 and a gate drive circuit 83 depicted in FIG. 22.

FIG. 23 shows the details of the arm 81 and the gate drive circuit 83 depicted in FIG. 22. The gate drive circuit 83 includes a switching gate control circuit 830 and a conduction gate control circuit 831. The arm 81 includes three switching devices 810, 811 and 812. The switching gate drive circuit 830 is connected to the control terminal of the switching device 810, and the conduction gate control circuit 831 is connected to the respective control terminals of the switching devices 811 and 812. The switching devices 810, 811 and 812 are connected in parallel, and their respective high electrical potential-side primary terminals are connected to one another, and their respective low electrical potential-side primary terminals are connected to one another. The arm 82 and the gate drive circuit 84 have similar structures to the structures shown in FIG. 23.

In the DC/DC converter 8 having such a structure, the switching gate control circuit 830 outputs a switching gate drive signal similar to the example shown in FIG. 4, and the conduction gate control circuit 831 outputs a conduction gate drive signal similar to the example shown in FIG. 4. Thus, as with the embodiments of the inverter 2 described above, the locations where the switching loss and the conduction loss occur in the DC/DC converter 8 can be separated between the switching devices performing the switching operation and the switching devices performing the conduction operation.

(2) All or some of the switching devices constituting the arms may be made up from wide bandgap semiconductors such as a SiC (silicon carbide) device and a GaN (gallium nitride) device.

SiC devices and GaN devices have higher breakdown resistance than Si devices, and lead to reduction in chip size. Therefore, such devices can reduce the size and the cost of the inverter, and furthermore improve the reliability.

Although the amount of loss occurring in these devices is smaller than Si devices, they cost higher. Thus, instead of using SiC devices or GaN devices for all the switching devices, they may be used for only the switching devices that contribute to the reduction of the loss.

For example, in a system that is largely affected by the switching loss rather than the conduction loss, the switching device 210u shown in FIG. 3, which primarily performs the switching operation, may be replaced with a SiC device or a GaN device. Similarly, in a system that is largely affected by the conduction loss rather than the switching loss, each of the switching devices 211u and 212u shown in FIG. 3, which primarily perform the conduction operation, may be replaced with a SiC device or a GaN device. Such a structure further reduces the loss while suppressing the cost.

(3) Any of Embodiments and Modifications may be combined with one another.

[Industrial Applicability]

The present invention realizes a high efficiency inverter. Furthermore, the present invention further improves the efficiency and the reliability by appropriately and individually controlling switching devices connected in parallel. Therefore, the present invention is applicable to, for example, motor drive systems that are required to achieve high efficiency, including hybrid electric vehicles and electric vehicles, fuel-cell electric vehicles, electrically-driven compressors, electrically-driven power steering systems and elevators, and to power generation systems that are also required to achieve high efficiency, such as wind power generators.

[Reference Signs List]

1: battery
2: invertor
3: motor
4: control circuit
8: DC/DC converter
21u-21w, 31u: upper arm
22u-22w: lower arm
23u-23w, 33u, 53u, 63u, 73u, 83u: upper arm-side gate drive circuit
24u-24w: lower arm-side gate drive circuit 25u-25w: leg
81, 82: arm
83, 84: gate drive circuit
85: inductor
101u, 101y, 101w, 102u, 102v, 102w: capacitor
200: parasitic capacitance
210u, 211u, 212u, 310u, 311u, 312u, 410u, 411u, 412u: switching device
230u, 430u, 830u: switching gate control circuit
231u, 431u, 831u: conduction gate control circuit
231u_1: conduction gate control circuit 1
231u_2: conduction gate control circuit 2
330: turn-on gate control circuit
331u: conduction gate control circuit
332u: turn-off gate control circuit
432u: primary voltage detection circuit
433u: primary voltage determination circuit
533u: first primary voltage determination circuit
534u: second primary voltage determination circuit
630u: switching current detection circuit
631u: switching current determination circuit
730u: first gate control circuit
731u: second gate control circuit
732u: third gate control circuit
733u: temperature detection circuit
734u: temperature determination circuit
830: switching gate control circuit
831: conduction gate control circuit
810, 811, 812: switching device
832u: low-current gate control circuit
833u: current-instruction determination circuit
1000: switching gate resistor
1001: conduction gate resistor
1002: gate resistor of lower arm 22u

The invention claimed is:

1. A power converter comprising: an upper arm; a lower arm; and gate drive circuits each configured to drive a corresponding one of the arms according to a reference signal, the reference signal having a first-potential period and a second-potential period, wherein
each arm includes a set of switching devices connected in parallel,
each gate drive circuit includes:
  a switching gate control circuit configured to bring a first switching device among the corresponding set of switching devices into conduction at the beginning of the first-potential period, and to bring the first switching device out of conduction at a point within the first-potential period;
  a turn-off gate control circuit configured to bring a third switching device among the corresponding set of switching devices into conduction at the beginning of the second-potential period, and to bring the third switching device out of conduction at a point within the second-potential period; and
  a conduction gate control circuit configured to bring a second switching device among the corresponding set of switching devices into conduction at a point within a period from when the first switching device is brought into conduction, which corresponds to the beginning of the first-potential period, until the first switching device is brought out of conduction, and to bring the second switching device out of conduction at a point within a period from when the third switching device is brought into conduction, which corresponds to the beginning of the second-potential period, until the third switching device is brought out of conduction, wherein
the first switching device has a smaller parasitic capacitance than the second switching device.

2. The power converter of claim 1, wherein
the first switching device has a smaller switching loss than the second switching device, and
the second switching device has a smaller conduction loss than the first switching device.

3. The power converter of claim 2, wherein
the first switching device is unipolar, and the second switching device is bipolar.

4. The power converter of claim 1, wherein
each gate drive circuit further includes:
  a primary voltage detection circuit configured to detect voltage between primary terminals of the switching devices; and
  a primary voltage determination circuit configured to determine whether the first switching device has been brought into conduction by comparing the voltage detected by the primary voltage detection circuit with a predetermined voltage, and
the conduction gate control circuit brings the second switching device into conduction when the primary voltage determination circuit determines that the first switching device has been brought into conduction.

5. The power converter of claim 4, wherein
each gate drive circuit further includes:
  a switching termination primary voltage determination circuit configured to determine whether the second switching device has been brought into conduction by comparing the voltage detected by the primary voltage detection circuit with a second predetermined voltage, and
the switching gate control circuit brings the first switching device out of conduction when the switching termination primary voltage determination circuit determines that the second switching device has been brought into conduction.

6. The power converter of claim 1, wherein
each gate drive circuit further includes:
  a switching current detection circuit configured to detect current flowing between primary terminals of the first switching device; and
  a switching current determination circuit configured to determine whether the first switching device has been brought into conduction based on the detection by the switching current detection circuit, and
the conduction gate control circuit brings the second switching device into conduction when the switching current determination circuit determines that the first switching device has been brought into conduction.

7. The power converter of claim 1, wherein
a second threshold voltage of the second switching device is lower than a first threshold voltage of the first switching device.

8. The power converter of claim 1, wherein
a potential difference between on-voltage and off-voltage output by the switching gate control circuit is larger than a potential difference between on-voltage and off-voltage output by the conduction gate control circuit.

9. The power converter of claim 1, wherein
each gate drive circuit includes the same number of gate control circuits as the switching devices included in the corresponding one of the arms, including the switching gate control circuit and the conduction gate control circuit, and
the gate control circuits corresponding one-to-one to the switching devices, and each of the control circuits controls a corresponding one of the switching devices in the same manner as the switching gate control circuit or the conduction gate control circuit.

10. The power converter of claim 1, wherein
a gate resistor is connected between a control terminal of each switching device and the gate control circuit controlling the switching device, and
the gate resistor connected to the control terminal of the second switching device is of higher resistance than the gate resistors connected to the control terminals of the rest of the switching devices.

11. The power converter of claim 1, wherein
the first switching device has a lower threshold voltage than the third switching device.

12. The power converter of claim 1, wherein
among the switching gate control circuit, the conduction gate control circuit, and the turn-off gate control circuit, the switching gate control circuit outputs on-voltage and off-voltage with the largest potential difference therebetween, followed by the conduction gate control circuit and the turn-off gate control circuit in this order.

13. The power converter of claim 1, wherein
the first switching device is a metal-oxide-semiconductor field-effect transistor, and the second switching device is an insulated gate bipolar transistor,
each gate drive circuit further includes a low-current gate control circuit configured to bring the first switching device into conduction for a period in which the corresponding arm is required to be conductive, and
when the power converter is driven with current falling within a range where the metal-oxide-semiconductor field-effect transistor requires lower voltage than the insulated gate bipolar transistor to obtain a desired current value, the gate drive circuit drives the corresponding arm by using the low-current gate control circuit, and
when the power converter is driven with a current falling within a range where the insulated gate bipolar transistor requires lower voltage than the metal-oxide-semiconductor field-effect transistor to obtain the desired current value, the gate drive circuit drives the corresponding arm by using the switching gate control circuit and the conduction gate control circuit.

14. The power converter of claim 1, wherein
the first switching device is a wide bandgap semiconductor.

15. The power converter of claim 1, wherein
the first switching device has a smaller current carrying capacity than the second switching device.

* * * * *